US011061457B1

(12) United States Patent
Bhattacharjee et al.

(10) Patent No.: US 11,061,457 B1
(45) Date of Patent: Jul. 13, 2021

(54) DYNAMIC SHARING OF POWER AMONG USB TYPE-C POWER DELIVERY (USB-C/PD) PORTS

(71) Applicant: Cypress Semiconductor Corporation, San Jose, CA (US)

(72) Inventors: Debraj Bhattacharjee, Bengaluru (IN); Kailas Iyer, Bangalore (IN); Palaniappan Subbiah, Santa Clara, CA (US); Subramanyam Sankaran, San Jose, CA (US); Anshul Gulati, San Jose, CA (US); Neel Karkhanis, Sunnyvale, CA (US)

(73) Assignee: Cypress Semiconductor Corporation, San Jose, CA (US)

(*) Notice: Subject to any disclaimer, the term of this patent is extended or adjusted under 35 U.S.C. 154(b) by 0 days.

(21) Appl. No.: 16/827,520

(22) Filed: Mar. 23, 2020

Related U.S. Application Data

(60) Provisional application No. 62/958,522, filed on Jan. 8, 2020.

(51) Int. Cl.
*G06F 1/26* (2006.01)
*G06F 1/3234* (2019.01)
(Continued)

(52) U.S. Cl.
CPC ............ *G06F 1/266* (2013.01); *G06F 1/189* (2013.01); *G06F 1/325* (2013.01); *G06F 1/3215* (2013.01);
(Continued)

(58) Field of Classification Search
CPC ........ G06F 1/266; G06F 1/189; G06F 1/3215; G06F 1/325; H02M 3/02; H02M 7/02; H01L 29/772
See application file for complete search history.

(56) References Cited

U.S. PATENT DOCUMENTS 8,046,600 B2 * 10/2011 Holle ...................... G06F 1/189
713/300
8,612,060 B2    12/2013 Harriman et al.
(Continued)

FOREIGN PATENT DOCUMENTS

WO      2019240796 A1    12/2019

OTHER PUBLICATIONS

Richtek; "Supporting Intelligent Power Distribution and Programmable Power Supply (PPS)" 3 Pages.
(Continued)

*Primary Examiner* — Jaweed A Abbaszadeh
*Assistant Examiner* — Brian J Corcoran

(57) ABSTRACT

Technology to dynamically share system power among charging ports of a multiport power delivery (PD) system is described. In one embodiment, a multiport PD system includes a master controller associated with a master port, and one or more slave controllers associated with one or more slave ports. The master controller determines a port connection status of a set of multiple ports. The port connection status indicates that multiple devices are connected. The master controller determines a power requirement of each of the devices. The master controller dynamically allocates a system power between each of the ports, independent of a connection sequence of the devices.

21 Claims, 14 Drawing Sheets

(51) Int. Cl.
  *G06F 1/3215* (2019.01)
  *H02M 7/02* (2006.01)
  *H01L 29/772* (2006.01)
  *H02M 3/02* (2006.01)
  *G06F 1/18* (2006.01)

(52) U.S. Cl.
  CPC ............ *H01L 29/772* (2013.01); *H02M 3/02* (2013.01); *H02M 7/02* (2013.01)

(56) References Cited

U.S. PATENT DOCUMENTS

| | | | |
|---|---|---|---|
| 8,661,268 B2 | 2/2014 | Brooks et al. | |
| 8,719,601 B2 | 5/2014 | Chang et al. | |
| 9,477,279 B1* | 10/2016 | Piszczek | G06F 11/3062 |
| 9,766,674 B2 | 9/2017 | Dunstan et al. | |
| 10,019,049 B2 | 7/2018 | Tan et al. | |
| 10,615,632 B2* | 4/2020 | Kadam | H02J 7/02 |
| 2009/0100275 A1* | 4/2009 | Chang | H02J 7/007 |
| | | | 713/300 |
| 2013/0336745 A1* | 12/2013 | Trinick | B21J 15/025 |
| | | | 411/501 |
| 2014/0075212 A1* | 3/2014 | Urbina | G06F 1/3287 |
| | | | 713/300 |
| 2014/0129855 A1* | 5/2014 | Hamdi | H04L 12/40045 |
| | | | 713/320 |
| 2016/0336745 A1 | 11/2016 | Pandya et al. | |
| 2018/0287491 A1* | 10/2018 | Muto | G06F 1/266 |
| 2018/0356873 A1 | 12/2018 | Regupathy et al. | |
| 2018/0364779 A1* | 12/2018 | Shpiro | H02J 2207/40 |
| 2019/0036365 A1 | 1/2019 | Regupathy et al. | |
| 2019/0115752 A1 | 4/2019 | Saunders | |
| 2019/0121764 A1 | 4/2019 | Regupathy et al. | |
| 2019/0171267 A1* | 6/2019 | Piwonka | G06F 1/28 |
| 2020/0012326 A1 | 1/2020 | Steele et al. | |

OTHER PUBLICATIONS

Texas Instruments; "TPS25810 USB Type-C DFP Controller and Power Switch with Load Detection" Jul. 2017; 39 pages.

* cited by examiner

DYNAMIC SHARING OF POWER AMONG USB TYPE-C POWER DELIVERY (USB-C/PD) PORTS

RELATED APPLICATIONS

This application claims the benefit of U.S. Provisional Application No. 62/958,522, filed Jan. 8, 2020, the entire contents of which are incorporated by reference.

BACKGROUND

Various electronic devices (e.g., such as smartphones, tablets, notebook computers, laptop computers, hubs, chargers, adapters, etc.) are configured to transfer power through Universal Serial Bus (USB) connectors according to USB power delivery protocols defined in various revisions of the USB Power Delivery (USB-PD) specification. For example, in some applications an electronic device may be configured as a power consumer to receive power through a USB connector (e.g., for battery charging), while in other applications an electronic device may be configured as a power provider to provide power to another device that is connected thereto through a USB connector. The USB-PD specification, however, allows power providers and power consumers to dynamically negotiate the levels of the provided voltages and currents.

BRIEF DESCRIPTION OF THE DRAWINGS

The disclosure is illustrated by way of example, and not of limitation, in the figures of the accompanying drawings.

DETAILED DESCRIPTION

Figure 1:
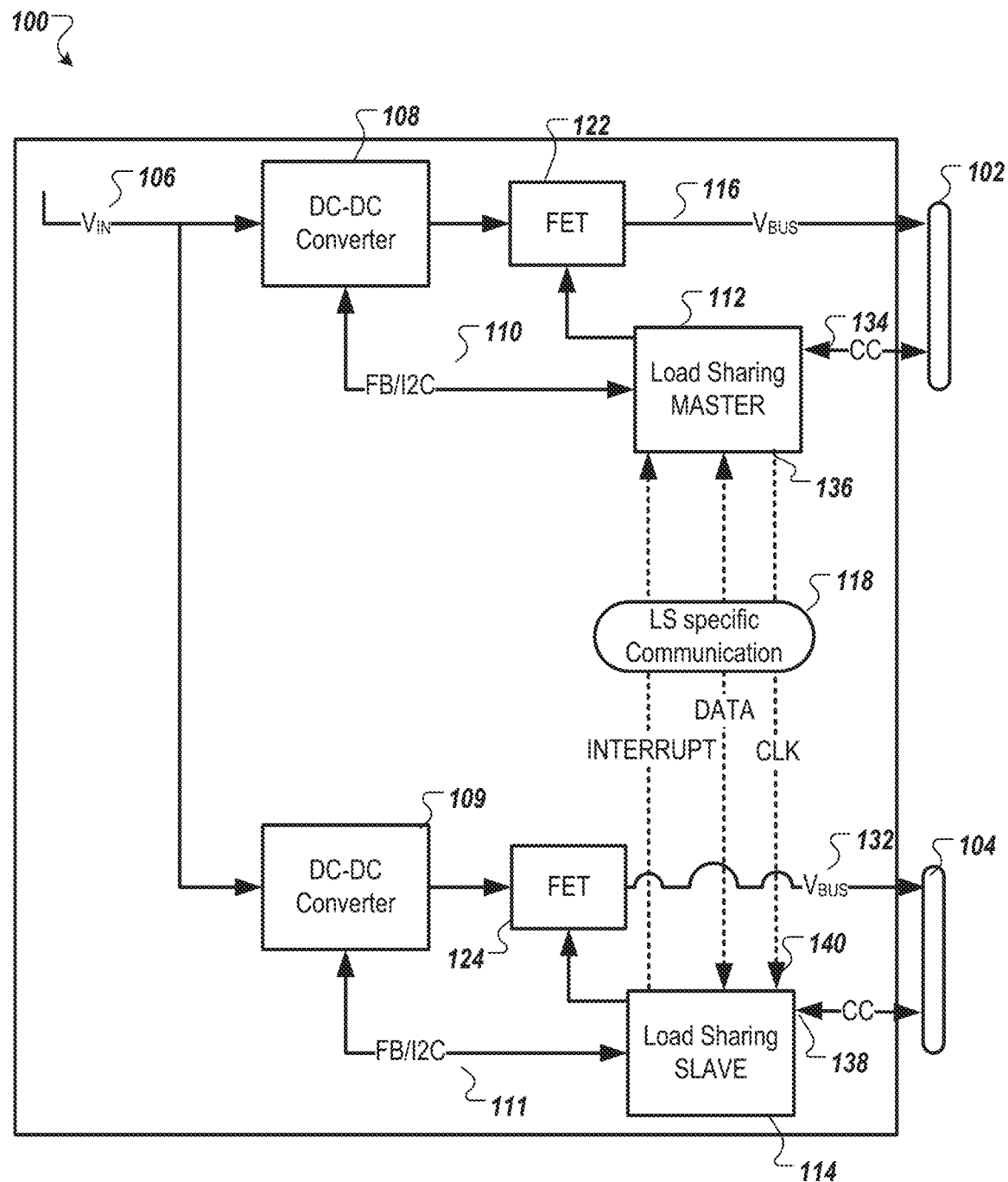
FIG. 1 is a block diagram of a multiport power delivery (PD) system with a master port and a slave port according to one embodiment.

The following description sets forth numerous specific details such as examples of specific systems, components, methods, and so forth, in order to provide a good understanding of various embodiments of the techniques described herein for enabling dynamic and intelligent sharing of system power among connected USB-C/PD charging ports. The techniques allow for dynamic and intelligent sharing of system power without leaving any of the system power unallocated. USB-C/PD can also be referred to as USB-C/PD. It will be apparent to one skilled in the art, however, that at least some embodiments may be practiced without these specific details. In other instances, well-known components, elements, or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the spirit and scope of the present invention.

Reference in the description to "an embodiment," "one embodiment," "an example embodiment," "some embodiments," and "various embodiments" means that a particular feature, structure, step, operation, or characteristic described in connection with the embodiment(s) is included in at least one embodiment of the invention. Further, the appearances of the phrases "an embodiment," "one embodiment," "an example embodiment," "some embodiments," and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

Described herein are various embodiments of techniques for enabling intelligent and dynamic sharing of system power among connected USB-C/PD charging ports or multiport USB-C/PD controllers. The techniques allow for dynamic and intelligent sharing of system power without leaving any of the system power unallocated. Examples of such electronic devices include, without limitation, personal computers (e.g., laptop computers, notebook computers, etc.), mobile computing devices (e.g., tablets, tablet computers, e-reader devices, etc.), mobile communication devices (e.g., smartphones, cell phones, personal digital assistants, messaging devices, pocket PCs, etc.), connectivity and charging devices (e.g., hubs, docking stations, adapters, chargers, etc.), audio/video/data recording and/or playback devices (e.g., cameras, voice recorders, hand-held scanners, monitors, etc.), and other similar electronic devices that can use USB connectors (interfaces) (such as USB-C, USB-A, Micro-USB, and the like) for communication, battery charging, and/or power delivery. The embodiments described herein can be used for various types of power adapters, GaN based power adapters operating at 600 kHz frequencies, power adapters with primary or secondary side controllers, power adapters operating in modes of operations, such as quasi-resonant mode (QR), discontinuous conduction mode (DCM), continuous conduction mode (CCM), or the like. The embodiments described herein can be used in power-adapter solutions along with Type-C PD capability. Aspects of the present disclosure can enable a power source to have much lower capacity, thereby reducing cost and complexity, while continuing to efficiently employ the maximum charging potential of underlying USB-C/PD ports.

A USB-enabled electronic device or a system may comply with at least one release of a USB specification. Examples of such USB specifications include, without limitation, the USB Specification Revision 2.0, the USB 3.0 Specification, the USB 3.1 Specification, and/or various supplements (e.g., such as On-The-Go, or OTG), versions and errata thereof. The USB specifications generally define the characteristics (e.g., attributes, protocol definition, types of transactions, bus management, programming interfaces, etc.) of a differential serial bus that are required to design and build standard communication systems and peripherals. For example, a USB-enabled peripheral device attaches to a USB-enabled host device through a USB port of the host device to form a USB-enabled system. A USB 2.0 port includes a power voltage line of 5V (denoted VBUS), a differential pair of data lines (denoted D+ or DP, and D− or DN), and a ground line for power return (denoted GND). A USB 3.0 port also provides the VBUS, D+, D−, and GND lines for backward compatibility with USB 2.0. In addition, to support a faster differential bus (the USB SuperSpeed bus), a USB 3.0 port also provides a differential pair of transmitter data lines (denoted SSTX+ and SSTX−), a differential pair of receiver data lines (denoted SSRX+ and SSRX−), a power line for power (denoted DPWR), and a ground line for power return (denoted DGND). A USB 3.1 port provides the same lines as a USB 3.0 port for backward compatibility with USB 2.0 and USB 3.0 communications, but extends the performance of the SuperSpeed bus by a collection of features referred to as Enhanced SuperSpeed.

A more recent technology for USB connectors, called USB Type-C, is defined in various releases and/or versions of the USB Type-C specification. The USB Type-C specification defines Type-C receptacle, Type-C plug, and Type-C cables that can support USB communications as well as power delivery over newer USB power delivery protocols defined in various revisions/versions of the USB-PD specification. Examples of USB Type-C functions and requirements may include, without limitation, data and other communications according to USB 2.0 and USB 3.0/3.1, electro-mechanical definitions and performance requirements for Type-C cables, electro-mechanical definitions and performance requirements for Type-C receptacles, electro-mechanical definitions and performance requirements for Type-C plugs, requirements for Type-C to legacy cable assemblies and adapters, requirements for Type-C-based device detection and interface configuration, requirements for optimized power delivery for Type-C connectors, etc. According to the USB Type-C specification(s), a Type-C port provides VBUS, D+, D−, GND, SSTX+, SSTX−, SSRX+, and SSRX− lines, among others. In addition, a Type-C port also provides a Sideband Use (denoted SBU) line for signaling of sideband functionality and a Configuration Channel (denoted CC) line for discovery, configuration, and management of connections across a Type-C cable. A Type-C port may be associated with a Type-C plug and/or a Type-C receptacle. For ease of use, the Type-C plug and the Type-C receptacle are designed as a reversible pair that operates regardless of the plug-to-receptacle orientation. Thus, a standard USB Type-C connector, disposed as a standard Type-C plug or receptacle, provides terminals for four VBUS lines, four ground return (GND) lines, two D+ lines (DP1 and DP2), two D− lines (DN1 and DN2), two SSTX+ lines (SSTXP1 and SSTXP2), two SSTX− lines (SSTXN1 and SSTXN2), two SSRX+ lines (SSRXP1 and SSRXP2), two SSRX− lines (SSRXN1 and SSRXN2), two CC lines (CC1 and CC2), and two SBU lines (SBU1 and SBU2), among others.

Some USB-enabled electronic devices may be compliant with a specific revision and/or version of the USB-PD specification. The USB-PD specification defines a standard protocol designed to enable the maximum functionality of USB-enabled devices by providing more flexible power delivery along with data communications over a single USB Type-C cable through USB Type-C ports. The USB-PD specification also describes the architecture, protocols, power supply behavior, parameters, and cabling necessary for managing power delivery over USB Type-C cables at up to 100 W of power. According to the USB-PD specification, devices with USB Type-C ports (e.g., such as USB-enabled devices) may negotiate for more current and/or higher or lower voltages over a USB Type-C cable than are allowed in older USB specifications (e.g., such as the USB 2.0 Specification, USB 3.1 Specification, the USB Battery Charging Specification Rev. 1.1/1.2, etc.). For example, the USB-PD specification defines the requirements for a power delivery contract (PD contract) that can be negotiated between a pair of USB-enabled devices. The PD contract can specify both the power level and the direction of power transfer that can be accommodated by both devices, and can be dynamically re-negotiated (e.g., without device un-plugging) upon request by either device and/or in response to various events and conditions, such as power role swap, data role swap, hard reset, failure of the power source, etc.

According to the USB-PD specification, an electronic device is typically configured to deliver power to another device through a power path configured on a USB VBUS line. The device that provides power is typically referred to as (or includes) a "provider" (or a power source), and the device that consumes power is typically referred to as (or includes) a "consumer" (or a power sink). A power path typically includes a power switch coupled in-line on the VBUS line and configured to turn the delivery of power on and off.

In one embodiment, a USB-PD power source can be configured to draw power from a direct current (DC) power source, and can include a direct current-to-direct current (DC-DC) converter. In other embodiments, a USB-PD power source may be configured to draw power from an alternating current (AC) power adapter or from another AC source. Thus, as part of an alternating current-to-direct current (AC-DC) conversion, some implementations may use a large bulk capacitor on the power source side of the VBUS line in order to remove the AC component of the power signal. Turn-ON and turn-OFF of power switches (also referred to as power FETs) may allow for further circuit protection based on analysis of current and voltage conditions and the detection of faults.

In a USB-C/PD (also referred to as USB Type-C/PD) charger with multiple ports, power sharing solutions are necessary to match a power budget of a port. Using a lower capacity power source, which provides a lower system power, can lead to faults when each port is utilizing its full power capability simultaneously. Additionally, for a given power source, increasing the capability of individual ports is not possible without increasing the system power or fuse rating. Some power sharing techniques are implemented with little to no adaptability, and use techniques such as fair sharing, first-come-first-serve, and/or limiting the power available to each port. In fair sharing, each port is allocated the same amount of power regardless of how many devices are connected or the power requirements of the connected devices. In first-come-first-serve, the first device to connect will be allocated power based on its power requirement, the any subsequent devices that are connected may not have their power requirements met. By limiting the power available to each port (e.g., to 15 W), power cannot be reallocated among other ports. In each of these techniques, failure detection between ports cannot be communicated. In another power sharing technique, an external controller, which is a separate controller from the USB-C/PD controllers coupled to the individual ports, can be implemented to allocate the power budget. However, this technique may lack a fair share implementation, may not redistribute unused power, and may be limited to sharing power between two ports. Further communication failure between the external controller and the ports may not be detected.

Described herein are various embodiments of techniques for enabling intelligent and dynamic power sharing among connected USB-C/PD charging ports. The embodiments described herein may address the above-mentioned and other challenges by providing an algorithm to sense the power requirement of the connected sink devices, if any, and to distribute the power intelligently among the ports, independent of the connection sequence. The embodiments can reduce form factors and can be seamlessly integrated into existing designs by defining a power sharing master as a sole power deliver decision maker and one or more power sharing slaves that respond to the power sharing master. The embodiments facilitate run-time configuration of the master and slave roles based on system requirements, thereby enabling a symmetric firmware-based method, with no effect on USB data transfer or user experience. Embodiments described herein incorporate a mechanism for detecting a faulty sink connection and for preventing the faulty sink connection from affecting other ports, thereby increasing robustness of the power delivery system. Power sharing ports are independent so they can continue to function if communication between the ports is broken. The embodiments enable fair and intelligent redistribution of unused power, are resilient to communication failures, are scalable to systems with more than two ports, and are compatible with a dynamic power throttling algorithm.

Though embodiments described herein relate to techniques for enabling intelligent and dynamic power sharing among connected USB-C/PD charging ports, the techniques are not limited to power sharing among USB-C/PD ports. For example, the techniques can be applied to other types of resource allocation, in which a resource is to be intelligent and dynamically allocated. In another example, the techniques can be applied in cases of various other battery charging protocols.

In one embodiment, a power sharing master may include a master controller associated with a master port, and a power sharing slave may include a slave controller associated with a slave port. In another embodiment, a power sharing master may include a master controller and a first set of ports, and a power sharing slave may include a slave controller and a second set of ports. In another embodiment, a single master controller may be associated with a set of two or more ports, and may dynamically and intelligently distribute power among the set of two or more ports.

The power sharing master can track the port connection status for all power sharing ports (the master port and all slave ports) and send commands to power sharing slaves to update a power delivery power (PDP) of their corresponding slave ports, independent of a connection sequence of devices to the power sharing ports. A PDP of a port is a fraction of the total system power that a given port is allowed to provide to a sink device. The power sharing slaves trigger necessary PDP changes as directed by the master and notifies the master about their port connection statuses. The power sharing master can send heartbeat messages to the power sharing slaves and the power sharing slaves can acknowledge the master initiated heartbeat messages. On detection of a communication failure with any slaves, the master can perform necessary power budget reduction. Similarly, slaves can perform necessary power budget reduction on communication failure detection with the master.

FIG. 1 is a block diagram of a multiport power delivery system 100 with a master port 102 and a slave port 104 according to one embodiment. The multiport PD system 100 can be a USB-C/PD system. A firmware-based method can enable sharing of system power among ports, such as master port 102 and slave port 104, of multiport PD system 100. Master port 102 is controlled by master controller 112, which is a sole PDP decision maker, while slave port 104 is controlled by slave controller 114, which is a PDP responder that can respond to commands initiated by master controller 112. Master controller 112 is also referred to as load sharing (LS) master controller 112, and slave controller 114 is also referred to as LS slave controller 114 herein. Master controller 112 is configured to obtain a port connection status of slave port 104 from slave controller 114. Master controller 112 is further configured to allocate fair share power to all ports. Master controller 112 and slave controller 114 can then perform power redistribution based on connected ports. It should be noted that master port 102 and slave port 104 may be identical. It should be noted that master controller 112 and slave controller 114 may be identical, except that master controller 112 is assigned (or otherwise programmed) by the firmware-based method to operate as the master to control slave controller 114 and slave controller 114 is assigned (or otherwise programmed) by the firmware-based method to operate as the slave and to respond to master controller 112.

Multiport PD system 100 has an input voltage VIN from a power source at input line 106. The power source provides a system power (or total system power) to multiport PD system 100. Power converter 108 converts an input voltage to a different voltage to be supplied to master port 102. Power converter 109 converts the input voltage to a different voltage to be supplied to slave port 104. In one embodiment, power converters 108 and 109 can decrease the input voltage VIN to a lower voltage (e.g., referred to as a step down in voltage). Serial bus line 110 couples power converter 108 to LS master controller 112. Serial bus line 111 couples power converter 109 to LS slave controller 114. In the depicted embodiment, the power source, which is coupled to power converter 108 and power converter 109, supplies a system power to be allocated between master port 102 and slave port 104. Field effect transistor (FET) 122 may be toggled on or off to provide power to master port 102. LS master controller 112 provides a signal to toggle FET 122 on or off. FET 124 may be toggled on or off to provide power to slave port 104. LS slave controller 114 provides a signal to toggle FET 124 on or off. FETs 122 and 124 are coupled to master port 102 and slave port 104 by Vbus lines 116.

In some embodiments, power converters 108 can be linear DC-DC converters, switched DC-DC converters, AC-DC converters, or the like. Though depicted in FIG. 1 as DC-DC converters, power converters 108 can be implemented AC-DC converters or other power converters. FETs 122 and 124 can be N-channel FETs, P-channel FETs, or the like. Master port 102 and slave port 104 can be USB Type-C ports, Micro-USB ports, USB Type-A ports, other power-providing or power-receiving ports, or the like.

LS master controller 112 and LS slave controller 114 can be configured to communicate for load sharing (or power sharing) via communication interface 118. Communication interface 118 can be over a unidirectional clock (CLK) line where LS master controller 112 sends a clock signal to LS slave controller 114, a unidirectional interrupt line where LS slave controller 114 sends an interrupt signal to LS master controller 112, and a bidirectional data line where signals are sent between LS master controller 112 and LS slave controller 114. Communication interface 118 can be a serial communication interface such as I2C, recommended standard (RS)-232, RS-485, serial peripheral interface (SPI), or the like. The role of LS master controller 112 is to keep track of all port connection statuses, including a port connection status of its own port (master port 102) and a port connection status of slave port 104. In one embodiment, LS slave controller 114 notifies LS master controller 112 about the port connection status of slave port 104. In another embodiment, LS master controller 112 may query LS slave controller 114 about the port connection status of slave port 104. The port connection status may be an indication of whether or not a sink device is attached or connected to the port. If a sink device is connected to a port, the port is referred to as attached. If no sink device is connected to a port, the port is referred to as detached. LS master controller 112 can send commands to LS slave controller 114 to update the PDP of slave port 104. In response to receiving a command from LS master controller 112, LS slave controller 114 triggers a PDP change based on the received command. A sink device may be any device that is attached or connected to a port and consumes power from the port, such as a cell phone, tablet, laptop, or the like.

In one embodiment, LS master controller 112 includes a first terminal 134 coupled to master port 102 and a first set of terminals 136 coupled to communication interface 118. LS slave controller 114 includes a second terminal 138 coupled to slave port 104 and a second set of terminals 140 coupled to communication interface 118. LS master controller 112 and LS slave controller 114 are coupled and communicate via communication interface 118.

The commands sent by LS master controller 112 depend on the connection statuses of all ports of multiport PD system 100. LS master controller 112 may send a first type of command when all ports of multiport PD system 100 are disconnected, a second type of command when one port of multiport PD system 100 is connected, and a third type of command when more than one port of multiport PD system 100 is connected.

The firmware-based method is configured to distribute a total system power (SP) among N ports independent of the sequence in which the ports are attached. The total system power can be distributed without leaving any of the total system power unallocated. It is worth noting that although two ports are shown in FIG. 1, a multiport PD system can have some positive integer (N) number of ports, such as three, four, five, or more. Each port is capable of sourcing an individual port budget (PB) (also referred to as a port power herein). The individual port budget (PB) is less than the system power (SP), e.g., PB<SP. However, the total port power of all of the ports (N*PB) can be greater than the system power, e.g., N*PB>SP, although the algorithm for dynamic and intelligent power sharing prevents the total output of the multiport PD system from outputting a power greater than SP. When all N ports are detached, each of the N ports can be allocated a fair share amount of power, e.g., SP/N. When one port is attached, the attached port can be allocated PB. A residual power, or an unused power, of the system is a difference between the system power and the power budget of the connected port (e.g., SP−PB). The remaining detached ports (of which there are N−1) can be allocated a fair share amount of the residual power, e.g., (SP−PB)/(N−1), where N−1 represents a number of remaining disconnected powers. When more than one port is connected, initially SP/N can be allocated to each port followed by a redistribution of unused power among the attached ports. If a port selects less than SP/N amount of power, it may be referred to as a DOWN port herein. If a port selects SP/N amount of power, it may be referred to an UP port herein. DOWN ports are reallocated a lower PDP, creating residual power to be redistributed among the UP ports. The residual power is reallocated to UP ports in a fair share model.

LS master controller 112 can send messages to LS slave controller 114 to determine whether there is a communication failure between LS master controller 112 and LS slave controller 114. In one embodiment, the messages are heartbeat messages that LS master controller 112 sends to LS slave controller 114 at regular predetermined intervals. In one embodiment, the regular predetermined intervals may be a number of seconds and can be programmable. In another embodiment, the messages are heartbeat messages that LS master controller 112 sends to LS slave controller 114 at various points in time during the operation of multiport PD system 100. In some embodiments, heartbeat messages may not be at regular predefined intervals, for example if there are interim communication issues between LS master controller 112 and LS slave controller 114, or if there is a permanent communication breakdown. If LS slave controller 114 does not receive a heartbeat message in a first threshold amount of time, it determines that there is a communication failure between LS slave controller 114 and LS master controller 112. When LS slave controller 114 receives a heartbeat message, it sends an acknowledgement, or a heartbeat acknowledgement, to LS master controller 112. If LS master controller 112 does not receive a heartbeat acknowledgement in a second threshold amount of time, it determines that there is a communication failure between LS master controller 112 and LS slave controller 114. Once a communication failure is detected, both the PDP of master port 102 and slave port 104 are reduced to fair share, e.g., SP/N, if their previously allocated PDP was greater than fair share.

The LS master controller 112 can determine whether a change of status of the master port 102 or the slave port 104 is valid or invalid. In some embodiments, the change of status may be determined to be valid if a user is attaching/detaching a sink device to the multiport PD system 100, if the sink device no longer requires to draw power, or the like. In some embodiments, the change of status may be determined to be invalid if the sink device has a faulty connection to the multiport PD system 100, if the sink device malfunctions, or the like. In some embodiments, when at least one port (either the master port 102 or the slave port 104) is already attached, any subsequent port status change is considered valid if it is unchanged or stable after a threshold duration of time, referred to herein as tDebounce, is passed. tDebounce is a duration of time through which the port status change should remain consistent to be considered valid when at least one other port is already attached. If the port connection status is not consistent for the threshold duration of time, the change of the port connection status is ignored by the LS master controller 112. In some embodiments, tDebounce may be a number of milliseconds. Alternatively, tDebounce can be other amounts of time. Any power sharing specific PDP update to the master port 102 or the slave port 104 happens only after tDebounce has passed. This allows the multiport PD system 100 to be resilient to a bad sink device connection or disconnection and prevents unnecessary power reallocations to already connected ports under such a scenario.

Although multiport PD system 100 is depicted in FIG. 1 as having one slave port, in other embodiments, the multiport PD system can have a different number of slave ports, such as two, three, four, or other positive integer number, N ports. Although multiport PD system 100 is depicted in FIG. 1 as being a single device, the firmware-based method for intelligent and dynamic power sharing can be implemented in multiple PD devices with a common power source.

Although the multiport PD system 100 is depicted in FIG. 1 as having a master controller with an associated master port and a slave controller with an associated slave port, in other embodiments, the multiport PD system may have only a master controller that controls of the multiple ports. In such an embodiment, the master controller, to distribute power among the ports, sends commands directly to each respective port rather than to a slave controller.

Although multiport PD system 100 is depicted as being a power provider, in other embodiments, the multiport PD system may be a multiport power consumer. The multiport power consumer may be implemented with the firmware-based method is configured to intelligently and dynamically consume a total system power (SP) distributed among N ports.

Figure 2:
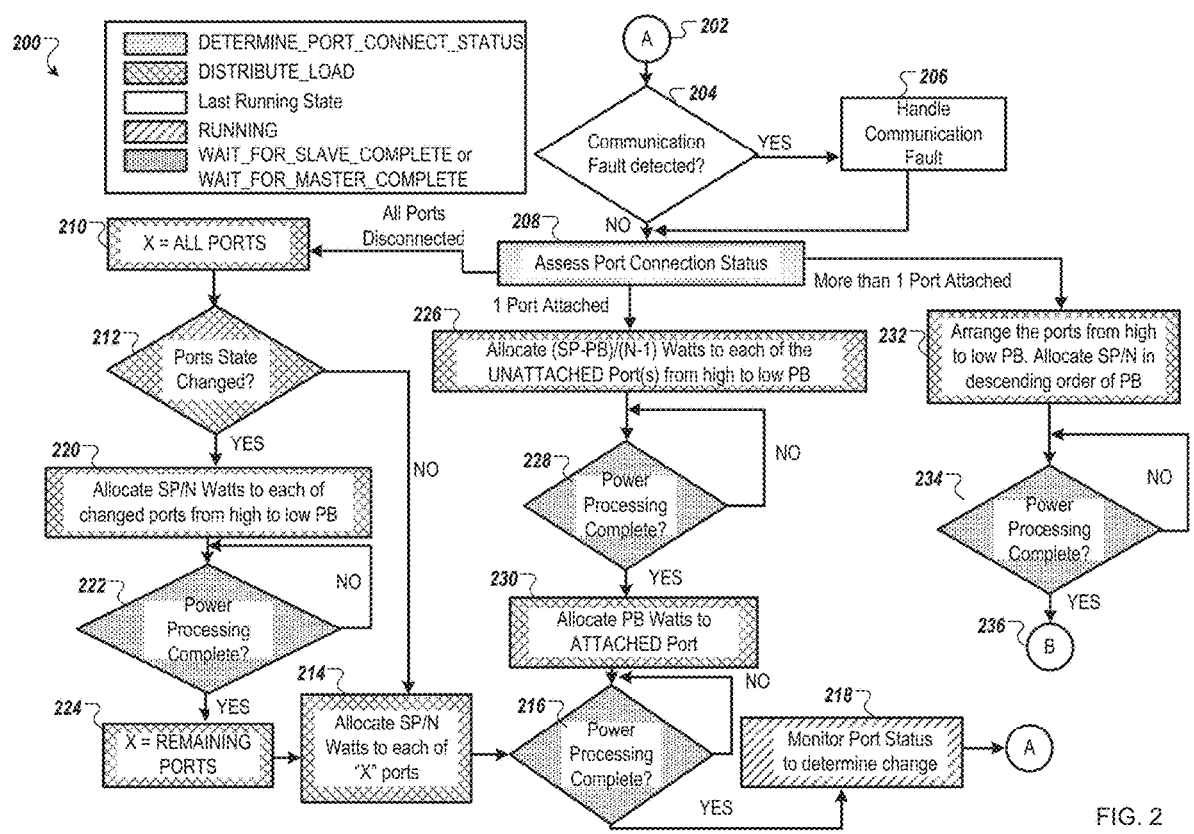
FIG. 2 is a flow diagram of a method of dynamic and intelligent power sharing among ports in a multiport PD system according to one embodiment.

FIG. 2 is a flow diagram of a method 200 of dynamic and intelligent power sharing among ports in a multiport PD system according to one embodiment. The method 200 may be performed by processing logic that comprises hardware (e.g., circuitry, dedicated logic, programmable logic, microcode, etc.), software, firmware, or a combination thereof. In one embodiment, the method 200 may be performed by any of the processing devices described herein. In one embodiment, the method 200 is performed by processing logic of a master controller such as LS master controller 112 of FIG. 1. In one embodiment, the master controller executes a firmware-based method that performs the following operations. In another embodiment, the master controller has embedded code or logic and is configured to execute instructions to perform the following operations. While performing the method of dynamic and intelligent power sharing, the master controller enters various states of operation.

The method 200 begins at point A 202, which represents a previously running state. In the previously running state, the master controller may be monitoring for a change of a port connection status of a port. The port connection status indicates whether a port has a sink device that is connected. The change in the port connection status indicates that a sink device has been connected or disconnected from a port. The master controller is in a RUNNING state following a completion of power distribution for a previously determined change in port connection status. While monitoring for the change, the master controller may determine whether a communication fault or a communication failure is detected (block 204). A heartbeat message can be transmitted by the master controller to all slave controllers at predetermined regular intervals of time, tHeartBeat. If a slave controller does not receive a heartbeat message in a duration of time, tCommunicationFailure, it determines that there is a communication failure with the master controller. In one embodiment, the communication failure is caused by a failure of a serial communication interface between the master controller and the slave controller. In another embodiment, the communication failure is caused by a failure of the master controller or the slave controller. If a slave controller does receive the heartbeat message in the duration of time tCommunicationFailure, it transmits a heartbeat acknowledgement to the master controller. If the master controller does not receive a heartbeat acknowledgement from the slave controller for more than the duration of time tCommunicationFailure, it determines that there is a communication failure with the slave controller. In one embodiment, if a communication failure is detected, the master controller sets the PDP of the master port to a fair share value, SP/N, equal to a total system power divided among a total number of ports, if the PDP of the master port was previously greater than the fair share value and the slave controller sets the PDP of the slave port to the fair share value, SP/N if the PDP of the slave port was previously greater than the fair share value (block 206). In another embodiment, if a communication failure is detected, the master controller sets the PDP of the master port to a value that is less than the fair share value if the PDP of the master port was previously greater than the fair share value, and the slave controller sets the PDP of the slave port to a value that is less than the fair share value if the PDP of the slave port was previously greater than the fair share value.

The master controller can assess a port connection status (block 208). When the master controller assesses the port connection status, the master controller is in a DETERMINE_PORT_CONNECT_STATUS state. When the master controller is in the DETERMINE_PORT_CONNECT_STATUS state, the master controller determines or assesses the port connection status of all ports, and power allocation is subsequently determined based on the port connection status of all ports. Any change of port status will trigger the master controller to change its state to DETERMINE_PORT_CONNECT_STATUS. In one embodiment, a change of port status is caused when one or more sink devices are connected to or disconnected from any of the power sharing ports, leading to the port connection status being attached or detached, respectively. In another embodiment, a change of port status is caused when one or more sink devices have a faulty connection to the port, at which point the master controller performs a debounce method. The master controller may determine the port connection status as one of three possibilities: that all ports are disconnected, that one port is attached, or that more than one ports are attached. Once the master controller has determined the port connection status, the master controller enters a DISTRIBUTE_LOAD state. The DISTRIBUTE_LOAD state is a first level of PDP distribution. A power budget is an amount of power that the master controller allocates to a port, corresponding to a maximum amount of power that the port is allowed to provide to a connected sink device. In some cases, a sink device may request an amount of power (a requested power or a required power) that is lower than the port budget or indicate a higher power requirement (e.g., in the cases of a capability mismatch), and the master controller reconfigures the power budget allocated to each port.

In a first case, the master controller determines a port connection status in which all ports are disconnected. The master controller can enter the DISTRIBUTE_LOAD state and assigns ALL PORTS to the variable X (block 210). ALL PORTS refers to the total number of ports, so X=N. The master controller then checks if the state of any of the ports has changed (block 212) in order for the multiport PD system to have no ports attached. If there is no change to the status of any port, then this can indicate that the multiport PD system was initialized with no attached ports and a power budget, PB, of each port is equal to PB of each other port. The master controller can allocate a power equal to a portion of the total system power to each of the X ports (block 214). The fraction is equal to the total system power divided by the number of ports, or SP/N. In other embodiments, the portion can be equal to a fraction of the total system power, and each portion can be a different fraction of the total system power, that when summed equals the total system power. In other words, the total system power is allocated without leaving any of the total system power unallocated in some cases. In other cases, the total system power is substantially allocated. The master controller, to allocate a power to each of the ports, may send a signal to a slave controller corresponding to each of the ports, and which may cause the slave controller to update a PDP of its corresponding port. The master controller may further update the PDP of its own corresponding port. In order to ensure that the PDP of each of the ports has been successfully updated, the master controller exits the DISTRIBUTE_LOAD state and enters a WAIT_FOR_SLAVE_COMPLETE or a WAIT_FOR_MASTER_COMPLETE state. In the WAIT_FOR_SLAVE_COMPLETE state the master controller has triggered a slave PDP change and must wait for the slave controller to update the PDP of its corresponding slave port. The slave controller may send a notification to the master controller when the operation is complete to notify the master controller of the completion. In the WAIT_FOR_MASTER_COMPLETE state, the master controller has triggered a PDP change of its own master port and must wait for the operation to complete. The master controller performs a power processing complete check to check that the PDP of all ports has been successfully updated (block 216). Once the PDP of all ports has been successfully updated, and the master controller has received notification from the slave controllers, the master controller exits the WAIT_FOR_SLAVE_COMPLETE and the WAIT_FOR_MASTER_COMPLETE states and reenters the RUNNING state. The master controller can monitor the status of all ports to determine if there is a change (e.g., a communication failure, a port being attached, and the like) (block 218). The master controller may then repeat the process.

Returning to block 212, when the master controller is in the DISTRIBUTE_LOAD state, if the master controller instead determines that a state of one or more ports has changed, then this indicates that there was a sink device attached to one of the ports and that the sink device has been disconnected so that the multiport PD system no longer has any attached sink device. As further detailed below in the second case, when one sink device is attached, the port to which it was attached is allocated an amount of power PB, while the remaining ports are allocated a portion of the total remaining power, equal to (SP−PB)/(N−1), which is less than PB. In other embodiments, the portion can be equal to a fraction of the total remaining system power, and each portion can be a different fraction of the total system power, that when summed equals the total remaining system power. The master controller can allocate a first fraction of a total system power, the first fraction being SP/N, to each of the one or more ports in a descending order of power requirements (e.g., from high PB to low PB) (block 220). This is done so that the total power allocated to all ports never exceeds the total system power SP. The master controller then exits the DISTRIBUTE_LOAD state and enters the WAIT_FOR_SLAVE_COMPLETE and WAIT_FOR_MASTER_COMPLETE states. The master controller can then perform a power processing complete check (similar to the power processing complete check of block 216) (block 222). Once the master controller determines that power processing is complete, and that the PDP of the one or more ports have been successfully updated, the master controller exits the WAIT_FOR_SLAVE_COMPLETE and WAIT_FOR_MASTER_COMPLETE states and reenters the DISTRIBUTE_LOAD state. The master controller assigns REMAINING PORTS, corresponding to the ports for which the PDPs have not yet been updated, to the variable X (block 224). The master controller then performs the steps of blocks 214, 216, and 218 as described above.

It should be noted that in other embodiments, the master controller does not need to allocate the first fraction SP/N of the total system power to each of the one or more ports in a descending order of power requirements. For example, the master controller can allocate the first fraction to each of the one or more ports in a random order, a sequential order, or other order.

In a second case, in which the master controller determines that there is one attached port (following block 208) while it is in the DETERMINE_PORT_CONNECT_STATUS state the master controller enters the DISTRIBUTE_LOAD state and allocates a second fraction of the total system power, the second fraction being (SP−PB)/(N−1), to each of the attached ports from high PB to low PB (block 226). The master controller then changes its state to WAIT_FOR_SLAVE_COMPLETE and the WAIT_FOR_MASTER_COMPLETE and can perform a power processing complete check to ensure that the PDP of each of the unattached ports has been successfully updated (block 228). Once the master controller determines that the PDP of each of the unattached ports has been successfully updated, the master controller changes its state to DISTRIBUTE_LOAD and allocates a power of PB to the attached port, which allows the attached port to have the maximum power supported by a port (block 230). The master controller can then perform a power processing complete check to ensure that the PDP of the attached port has been successfully updated (block 216). Once the master controller has determined that the PDP of the attached port has been successfully updated, the master port changes its state to RUNNING and monitors all port statuses to determine if there is a change (block 218).

In a third case, in which the master controller determines that there is more than one attached port (following block 208) during the DETERMINE_PORT_CONNECT_STATUS state, the master controller enters the DISTRIBUTE_LOAD state. The master controller can then allocate a fair share power of SP/N to each port in the order from high PB to low PB to ensure that the total allocated power never exceeds the total system power SP (block 232). The master controller changes its state to WAIT_FOR_SLAVE_COMPLETE and/or WAIT_FOR_MASTER_COMPLETE and performs a power processing complete check to ensure that the PDP of the ports has been successfully updated (block 234). The master controller then changes its state to a REDISTRIBUTE_UNUSED_LOAD and performs a power redistribution method at point B 236.

In each of the second case and the third case, before the master controller changes its state from DETERMINE_PORT_CONNECT_STATUS (block 208) to DISTRIBUTE_LOAD (blocks 226 and 232) the master controller waits for a threshold time, tDebounce, before beginning to reallocate power. tDebounce is a timing parameter that defines a duration during which a port status change should remain consistent to be considered valid when at least one port is already connected. When at least one port is already attached, any subsequent port status change can be considered valid if it is consistent for the threshold time tDebounce. Power sharing specific PDP updates can happen when the status change is considered valid. This allows the system to be resilient to bad sink device connection or disconnection to a port and prevents unnecessary power reallocations to already connected ports under such a scenario. The master controller may apply the threshold time, tDebounce, to check that a change of status of a port is valid before performing any power allocation or reallocation, as ports may be attached or detached at any time during operation.

Figure 3:
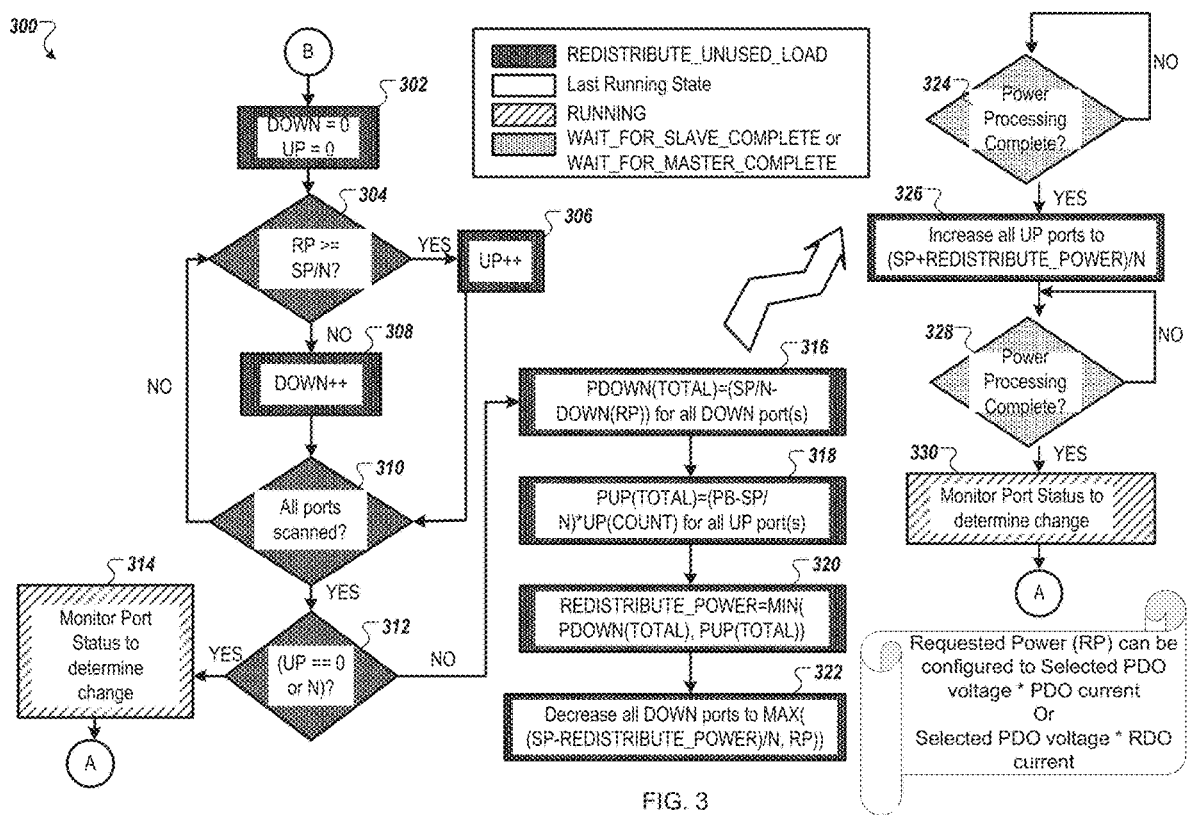
FIG. 3 is a flow diagram of a method of redistributing power among ports in a multiport PD system according to one embodiment.

FIG. 3 is a flow diagram of a method 300 of redistributing power among ports in a multiport PD system according to one embodiment. The method 300 may be performed by processing logic that comprises hardware (e.g., circuitry, dedicated logic, programmable logic, microcode, etc.), software, firmware, or a combination thereof. In one embodiment, the method 300 may be performed by any of the processing devices described herein. In one embodiment, the method 300 is performed by processing logic of a master controller such as LS master controller 112 of FIG. 1. In one embodiment, the master controller executes a firmware-based method that performs the following operations. In another embodiment, the master controller has embedded code or logic and is configured to execute instructions to perform the following operations.

The method 300 may be implemented when the master controller determines that there is more than one attached port and power should be redistributed among the attached ports. In one embodiment, the method 300 beings at point B 236 which is the same as point B 236 of FIG. 2. While performing the method of dynamic and intelligent power sharing, the master controller enters various states of operation.

At block 302, the master controller changes its state to REDISTRIBUTE_UNUSED_LOAD. When a sink device is connected or attached to a port, a port connection status of the port is attached, and the sink device requests an amount of power, RP, from the port. The requested amount of power, or requested power, can be configured to be a selected power data object (PDO) voltage multiplied by a PDO current or a selected PDO voltage multiplied by a requested data object (RDO) current. If there is no sink device connected to a port (e.g., if the port is detached), the requested power of the corresponding port is zero. The master controller can define an initial number of DOWN devices as zero and an initial number of UP devices as zero (block 302). An UP port is a port whose requested power is greater than or equal to the threshold value. In one embodiment, the threshold value is SP/N. In another embodiment, the threshold value can be chosen to be (SP/N)−1 in order to avoid any decimal conversion issues. The master controller compares the RP of each port against the threshold value (block 304) and counts the number of UP ports and the number of DOWN ports (blocks 306-310). In the REDISTRIBUTE_UNUSED_LOAD state, the master controller attempts to redistribute residual or unused power load of the DOWN ports to the UP ports if there is any. After the master controller counts the number of UP ports and the number of DOWN ports, the master controller can check if the number of UP ports is either zero or the total number of ports N (block 312). If there are no ports that are requested to deliver a power greater than or equal to the threshold value, the master controller is not required to redistribute the power among the ports, and each port maintains a fair share power of SP/N. If all of the ports are requested to deliver a power greater than or equal to the threshold value, there will be no unused power load for the master controller to redistribute. If the number of UP ports is equal to zero or N, the master controller does not need to or cannot redistribute power, and changes its state to RUNNING, and continues to monitor for port status changes (block 314).

If the number of UP ports is not equal to 0 or N, the master controller remains in the REDISTRIBUTE_UNUSED_LOAD state and proceeds to decrease power allocated to the DOWN ports and subsequently increase power allocated to the UP ports. The master controller calculates a first value SP/N−DOWN(RP) for each DOWN port and sums each of the first values to obtain PDOWN(TOTAL) (block 316). The master controller calculates a second value PUP(TOTAL)=(PB−SP/N)*UP(COUNT) for all UP ports (block 318). The master controller calculates a third value which is a minimum of the first value and the second value: REDISTRIBUTE_POWER=MIN(PDOWN(TOTAL), PUP(TOTAL)) (block 320). The master controller then decreases each DOWN port PDP by allocating a power of MAX((SP−REDISTRIBUTE_POWER)/N, RP) to each DOWN port (block 322), where RP is the requested power of the respective DOWN port. The master controller then enters a WAIT_FOR_SLAVE_COMPLETE or WAIT_FOR_MASTER_COMPLETE state to ensure that the PDP values for all DOWN ports have been successfully updated (block 324).

Once the PDP values for all DOWN ports have been successfully updated, the master controller returns to the REDISTRIBUTE_UNUSED_LOAD state. The master controller increases each UP port PDP by allocating a power of (SP+REDISTRIBUTE_POWER)/N to each UP port (block 326). The master controller then enters a WAIT_FOR_SLAVE_COMPLETE or WAIT_FOR_MASTER_COMPLETE state to ensure that the PDP values for all UP ports have been successfully updated (block 328). The master controller then changes its state to RUNNING, and monitors for port status changes (block 330).

Figure 4:
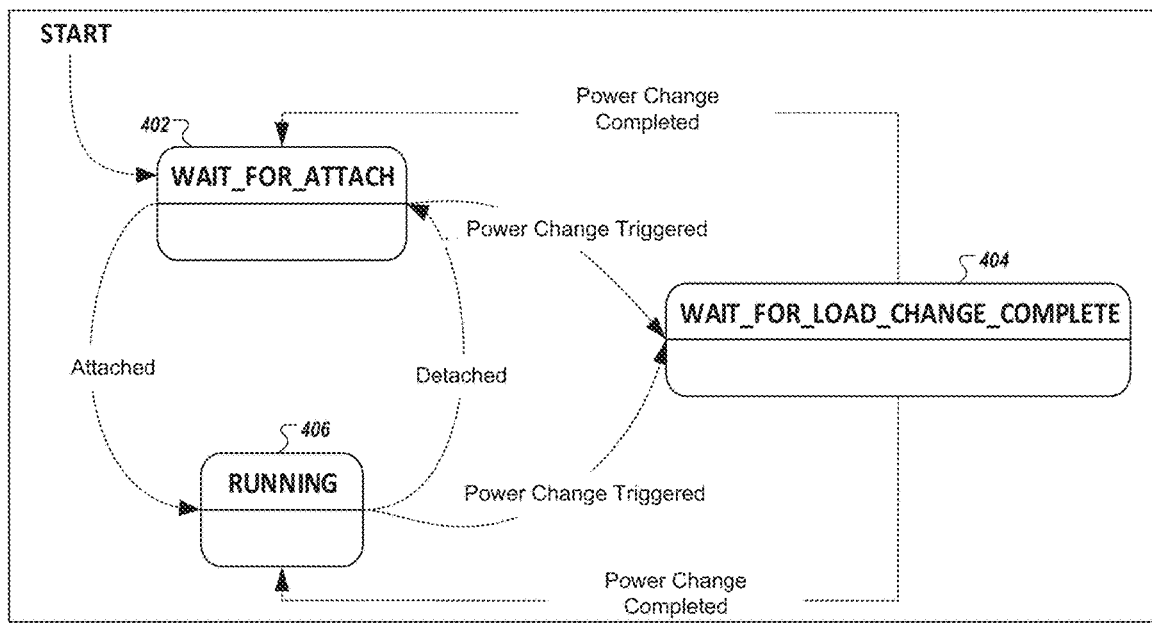
FIG. 4 is a schematic diagram of a finite state machine (FSM) of a slave controller of a multiport PD system according to one embodiment.

FIG. 4 is a schematic diagram of a finite state machine (FSM) 400 of a slave controller of a multiport PD system according to one embodiment. The FSM 400 may be implemented by processing logic that comprises hardware (e.g., circuitry, dedicated logic, programmable logic, microcode, etc.), software, firmware, or a combination thereof. In one embodiment, the FSM 400 may be performed by any of the processing devices described herein. In one embodiment, the FSM 400 is performed by processing logic of a slave controller such as LS slave controller 114 of FIG. 1. In one embodiment, the slave controller executes a firmware-based method that performs operations associated with the following states. In another embodiment, the slave controller has embedded code or logic and is configured to execute instructions to perform the operations associated with the following states.

The role of the slave controller is to trigger a PDP change of a slave port associated with the slave controller in response to receiving a command from a master controller, such as LS master controller 112 of FIG. 1, and to inform the master controller about the slave port status. The slave controller informs the master controller about the slave port connection status (e.g., whether or not the slave port is attached to a sink device) and to notify the master controller when the PDP change of the slave port is successfully completed. The slave controller receives periodic heartbeat messages at predefined regular intervals (tHeartBeat) from the master controller in order to check for communication failures. The slave controller transmits heartbeat acknowledgement messages to the master controller to acknowledge receipt of the heartbeat message. A communication failure can occur if the slave controller has not received a heartbeat message in a threshold amount of time (tCommunicationFailure). In the event of a communication failure with the master controller, the slave controller can perform necessary power budget reduction. In one embodiment, at the time of the communication failure, the PDP of the slave port is greater than the fair share value, SP/N, and the slave controller performs the necessary power budget reduction by updating the PDP of the slave port to the fair share value. In another embodiment, at the time of the communication failure, the PDP of the slave port is less than or equal to the fair share value, SP/N, and the slave controller performs the necessary power budget reduction by taking no action.

During operation of the multiport PD system, the slave controller operates in various states. Initially, when the multiport PD system is started, the slave controller is in a WAIT_FOR_ATTACH state (block 402). The slave controller stays in the WAIT_FOR_ATTACH state whenever the slave port is unattached. In the WAIT_FOR_ATTACH state, the slave controller may receive a command from the master controller to trigger a PDP change of the slave port. The slave controller enters a WAIT_FOR_LOAD_CHANGE_COMPLETE state (block 404), while it updates the PDP of the slave port and while the PDP change is in progress. The slave controller exits the WAIT_FOR_LOAD_CHANGE_COMPLETE state when it sends a notification to the master controller that the PDP change of the slave port is successful. When the PDP change is complete, the slave controller returns to the WAIT_FOR_ATTACH state.

If a sink device is connected to the slave port, the slave port becomes attached, and the slave controller enters a RUNNING state (block 406) in which power is provided to the sink device. The slave controller stays in the RUNNING state when it is attached, and when no PDP change is in progress. While the slave controller is in the RUNNING state, it may receive a command from the master controller to trigger a PDP change of the slave port. The slave controller enters a WAIT_FOR_LOAD_CHANGE_COMPLETE state (block 404), while it updates the PDP of the slave port and while the PDP change is in progress. The slave controller exits the WAIT_FOR_LOAD_CHANGE_COMPLETE state when it sends a notification to the master controller that the PDP change of the slave port is successful. When the PDP change is complete, the slave controller returns to the RUNNING state. If the sink device is disconnected from the slave port, the slave port becomes detached, and the slave controller returns to the WAIT_FOR_ATTACH state (block 402).

Figure 5:
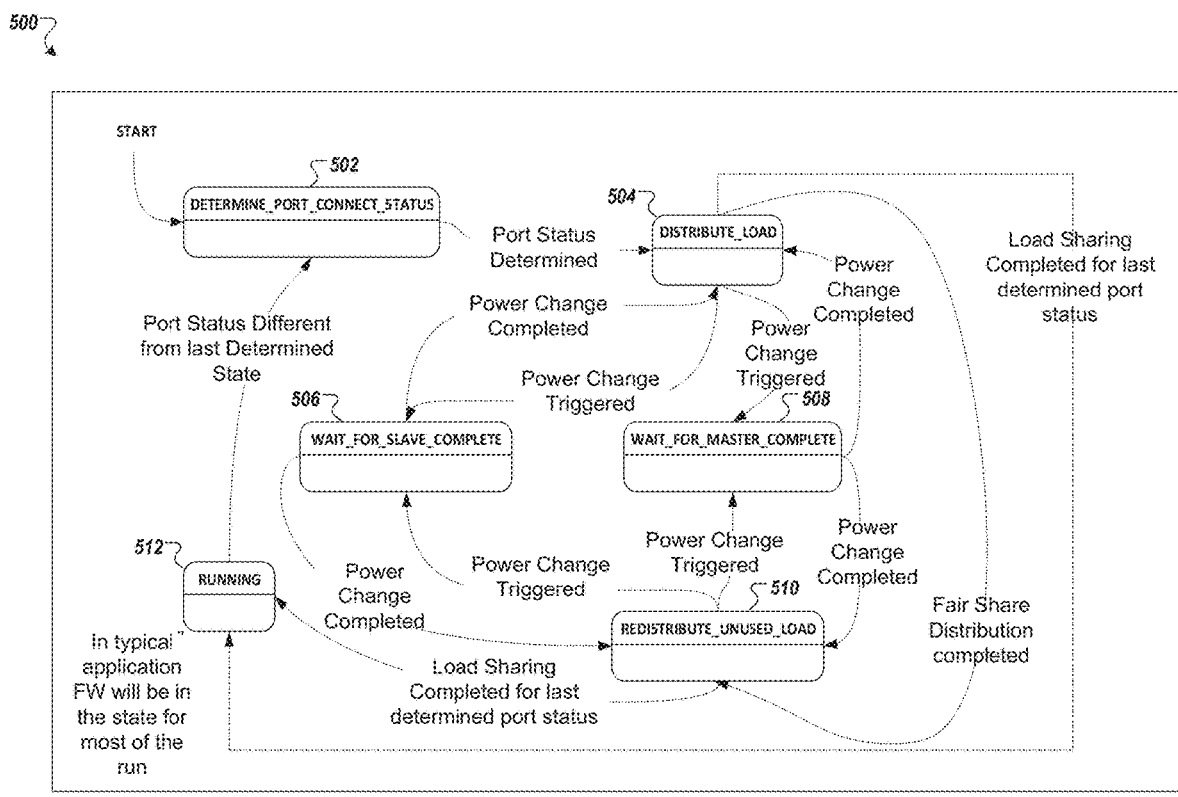
FIG. 5 is a schematic diagram of an FSM of a master controller of a multiport PD system according to one embodiment.

FIG. 5 is a schematic diagram of an FSM 500 of a master controller of a multiport PD system according to one embodiment. The FSM 500 may be performed by processing logic that comprises hardware (e.g., circuitry, dedicated logic, programmable logic, microcode, etc.), software, firmware, or a combination thereof. In one embodiment, the FSM 500 may be performed by any of the processing devices described herein. In one embodiment, the FSM 500 is performed by processing logic of a master controller such as LS master controller 112 of FIG. 1. In one embodiment, the master controller executes a firmware-based method that performs the operations associated with the following states. In another embodiment, the master controller has embedded code or logic and is configured to execute instructions to perform the operations associated with the following states. The master controller may be the LS master controller 112 of FIG. 1 and the multiport PD system may be the multiport PD system 100 of FIG. 1. The role of the master controller is to keep track of a port connection status of each port including slave ports and a master port. The master controller may be associated with the master port and the master controller determines a port connection status of the master port. The master controller can determine a port connection status of the slave ports by receiving a notification from corresponding slave controllers. The master controller sends commands to the slave controllers to update PDPs of the corresponding slave ports. The master controller receives notifications or indications from the slave controllers when the corresponding PDPs have been successfully updated. The master controller may update a PDP of the master port when necessary. The master controller can send periodic heartbeat messages at predefined regular intervals (tHeartBeat) to the slave controllers in order to monitor for communication failures. A communication failure with a slave controller can occur if the master controller has not received a heartbeat acknowledgement from the slave controller in a threshold amount of time (tCommunicationFailure). In the event of a communication failure with the slave controller, the master controller can perform necessary power budget reduction. In one embodiment, at the time of the communication failure, the PDP of the master port is greater than the fair share value, SP/N, and the master controller performs the necessary power budget reduction by updating the PDP of the master port to the fair share value. In another embodiment, at the time of the communication failure, the PDP of the master port is less than or equal to the fair share value, SP/N, and the master controller performs the necessary power budget reduction by taking no action.

In one embodiment, the master controller can determine to reallocate power among the ports when a sink device is connected or disconnected from a port, causing the port to become attached or detached respectively. In some cases, for example, when the sink device is faulty or has an intermittent connection to a port, the port connection status may change rapidly. If the port connection status changes within a threshold debounce time, tDebounce, the master controller regards it as invalid. The threshold debounce time is a timing parameter through which the port connection status change should remain consistent to be considered valid when at least one more port is already attached.

During operation of the multiport PD system, the master controller operates in various states. Initially, when the multiport PD system is started, the master controller is in a DETERMINE_PORT_CONNECT_STATUS state (block 502). In the DETERMINE_PORT_CONNECT_STATUS state, the master controller determines the port connection status of each port, including the master port and the slave port, as described in reference to block 208 of FIG. 2. The master controller determines how to allocate power among the ports based on the port connection status, as described in reference to FIG. 2 and FIG. 3.

When the port connection status of each port is known, the master controller enters a DISTRIBUTE_LOAD state (block 504). The DISTRIBUTE_LOAD state is a first level of PDP distribution. When the master controller is in the DISTRIBUTE_LOAD state, it may perform actions as described by blocks 210, 212, 214, 224, 226, 230, and 232 of FIG. 2. If there are no attached ports, the master controller allocates a fair share PDP of SP/N to each port. If there is one attached port, the master controller first allocates a PDP of (SP−PB)/(N−1) to each unattached port and subsequently allocates a PDP of PB to the one attached port. In both cases, the master controller then enters WAIT_FOR_SLAVE_COMPLETE and WAIT_FOR_MASTER_COMPLETE states (blocks 506 and 508) respectively. In some embodiments, the master controller can be in the WAIT_FOR_SLAVE_COMPLETE and WAIT_FOR_MASTER_COMPLETE states simultaneously. In other embodiments, the master controller can be in the WAIT_FOR_SLAVE_COMPLETE state first and the WAIT_FOR_MASTER_COMPLETE state subsequently, or can be in the WAIT_FOR_MASTER_COMPLETE state first and the WAIT_FOR_SLAVE_COMPLETE state subsequently. In the WAIT_FOR_SLAVE_COMPLETE state, the master controller waits to receive a notification from each slave controller that the PDP of the corresponding slave port has been successfully updated. In the WAIT_FOR_MASTER_COMPLETE state, the master controller waits for the PDP of the master port to be successfully updated. When PDP changes of all ports are completed, the master controller returns to the DISTRIBUTE_LOAD state. When PDP allocation (e.g., load sharing) is completed for the last determined port connection status, the master controller enters a RUNNING state (block 512). When the master controller is in the RUNNING state, it may perform actions as described by block 218 of FIG. 2 and blocks 314 and 330 of FIG. 3. The master controller is in the RUNNING state after completing power distribution for the last determined port connection status for each port. Any change of port connection status triggers the master controller state to DETERMINE_PORT_CONNECTION_STATUS (block 502). It should be noted that in a typical application, the master controller spends the most amount of time in the RUNNING state (in comparison to the other states).

If there are more than one attached ports, the master controller allocates a fair share PDP to each of the ports and enters the REDISTRIBUTE_UNUSED_LOAD state (block 510). When the master controller is in the REDISTRIBUTE_UNUSED_LOAD state, it may perform actions as described by blocks 302, 304, 305, 308, 310, 312, 316, 318, 320, 322, and 328 of FIG. 3. In the REDISTRIBUTE_UNUSED_LOAD state, the master controller attempts to reallocate power from ports that are unattached or ports that are attached with sink devices with low power requests (DOWN ports) to ports that are attached with sink devices with high power requests (UP ports). The master controller then enters the WAIT_FOR_SLAVE_COMPLETE and WAIT_FOR_MASTER_COMPLETE states (blocks 506 and 508) respectively. When PDP changes of all ports are completed, the master controller returns to the REDISTRIBUTE_UNUSED_LOAD state. When PDP reallocation (e.g., load sharing) is completed for the last determined port connection status, the master controller enters a RUNNING state (block 512). When the master controller is in the RUNNING state, it may perform actions as described by block 218 of FIG. 2 and blocks 314 and 330 of FIG. 3. The master controller is in the RUNNING state after completing power distribution for the last determined port connection status for each port. Any change of port connection status triggers the master controller state to DETERMINE_PORT_CONNECTION_STATUS (block 502). It should be noted that in a typical application, the master controller spends the most amount of time in the RUNNING state (in comparison to the other states).

Figure 6:
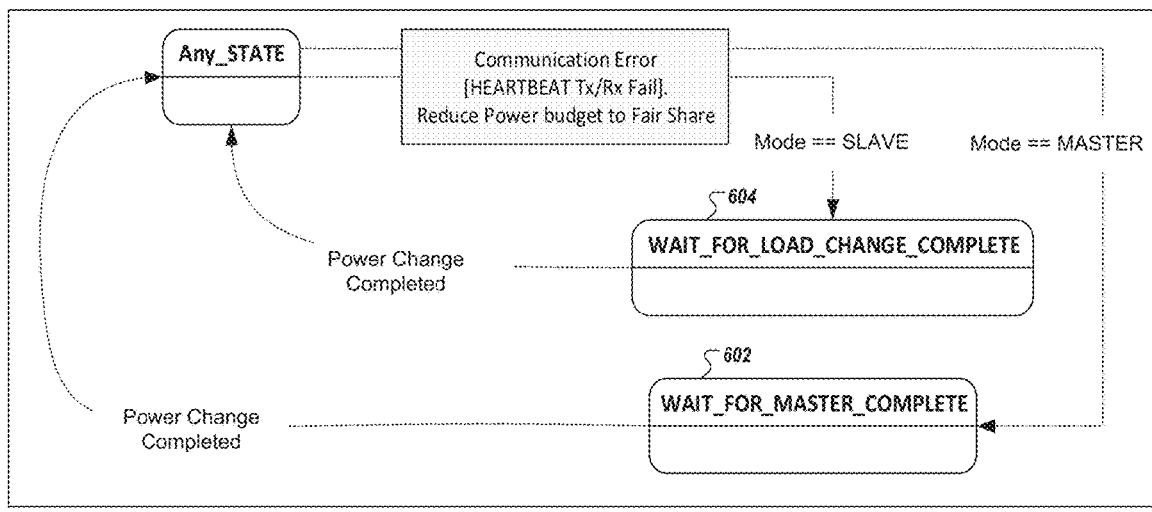
FIG. 6 is a schematic diagram of an FSM of master controller and slave controller communication fault handling according to one embodiment.

FIG. 6 is a schematic diagram 600 of an FSM of master controller and slave controller communication fault handling according to one embodiment. The FSM 600 may be implemented by processing logic that comprises hardware (e.g., circuitry, dedicated logic, programmable logic, microcode, etc.), software, firmware, or a combination thereof. In one embodiment, the FSM 600 may be performed by any of the processing devices described herein. In one embodiment, the FSM 600 is performed by processing logic of a controller such as LS master controller 112 of FIG. 1. In another embodiment, the FSM 600 is performed by processing logic of a controller such as LS slave controller 114 of FIG. 1. In one embodiment, the controller executes a firmware-based method that performs operations associated with the following states. In another embodiment, the controller has embedded code or logic and is configured to execute instructions to perform the operations associated with the following states.

A communication failure can happen at any time, and during any state of a master controller and slave controllers. The master controller sends periodic heartbeat messages at predefined regular intervals (tHeartBeat) to the slave controllers in order to monitor for communication failures. The slave controller receives the heartbeat messages and can transmit heartbeat acknowledgement messages to the master controller to acknowledge receipt of the heartbeat message. A communication failure between the slave controller and the master controller can occur if the slave controller has not received a heartbeat message from the master controller and the master controller has not received a heartbeat acknowledgement from the slave controller in a threshold amount of time (tCommunicationFailure). In the event of a communication failure between the master controller and the slave controller, both the master controller and the slave controller can perform necessary power budget reductions.

If, at the time of the communication failure, the PDP of the master port is greater than the fair share value, SP/N, the master controller can perform the necessary power budget reduction by updating the PDP of the master port to the fair share value. If, at the time of the communication failure, the PDP of the master port is less than or equal to the fair share value, SP/N, the master controller performs the necessary power budget reduction by taking no action. The master controller enters a WAIT_FOR_MASTER_COMPLETE state (block 602) while the necessary power budget reduction occurs, and returns to its previous state when the necessary power budget reduction completes. The WAIT_FOR_MASTER_COMPLETE state of block 602 may be the same as the WAIT_FOR_MASTER_COMPLETE state of block 508 of FIG. 5.

If, at the time of the communication failure, the PDP of the slave port is greater than the fair share value, SP/N, the slave controller performs the necessary power budget reduction by updating the PDP of the slave port to the fair share value. If, at the time of the communication failure, the PDP of the slave port is less than or equal to the fair share value, SP/N, the slave controller can perform the necessary power budget reduction by taking no action. The slave controller enters a WAIT_FOR_LOAD_CHANGE_COMPLETE state (block 604) while the necessary power budget reduction occurs, and returns to its previous state when the necessary power budget reduction completes. The WAIT_FOR_LOAD_CHANGE_COMPLETE state of block 604 may be the same as the WAIT_FOR_LOAD_CHANGE_COMPLETE state of block 404 of FIG. 4.

Figure 7:
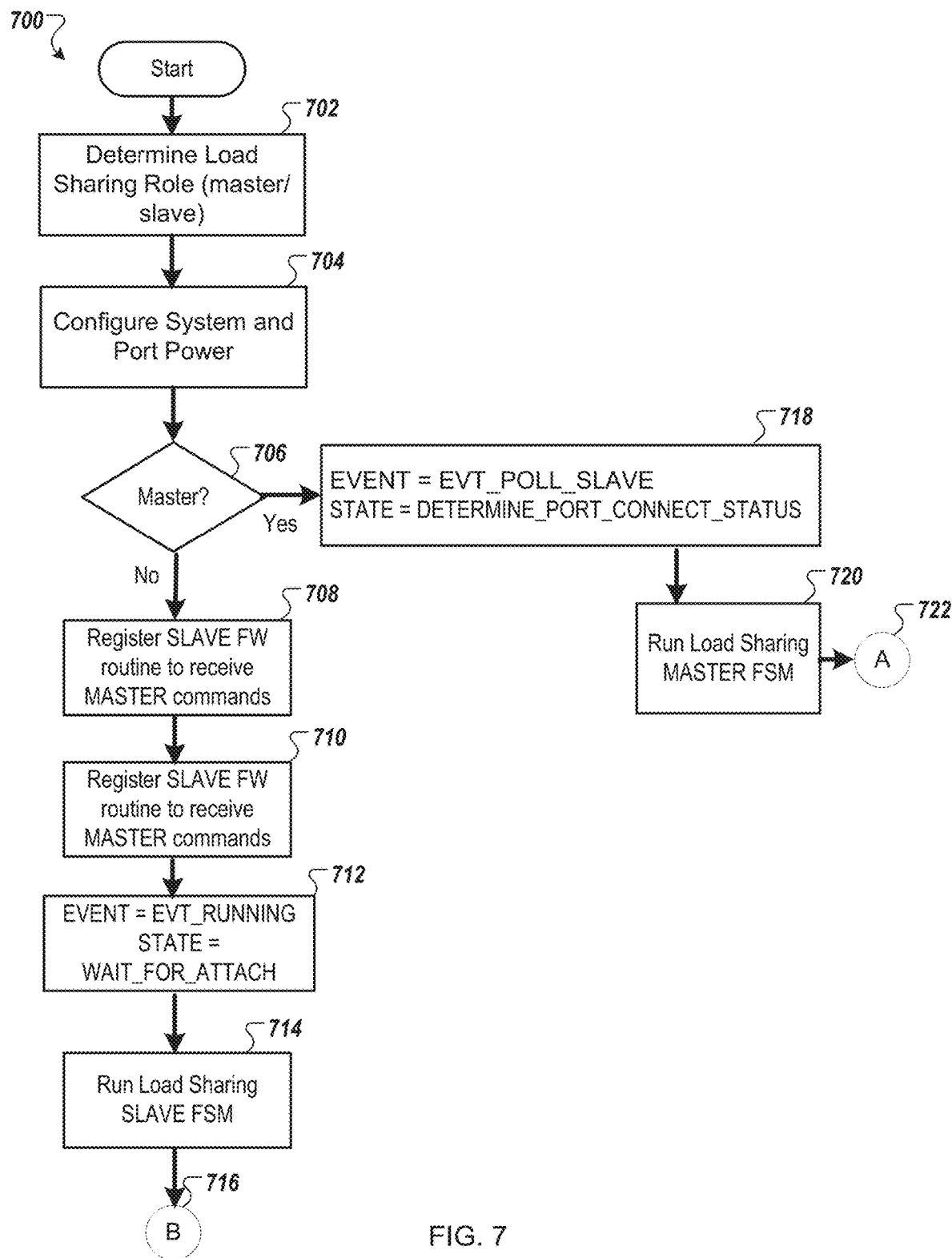
FIG. 7 is flowchart of a method of power sharing initialization according to one embodiment.

FIG. 7 is flowchart of a method 700 of power sharing initialization according to one embodiment. The method 700 may be performed by processing logic that comprises hardware (e.g., circuitry, dedicated logic, programmable logic, microcode, etc.), software, firmware, or a combination thereof. In one embodiment, the method 700 may be performed by any of the processing devices described herein. The method 700 may be implemented to determine the role (e.g., master or slave) of each controller in the multiport PD system.

The method 700 begins by the processing logic determining a load sharing role (e.g., master or slave) for each port and corresponding controller in a multiport PD system (block 702). In one embodiment, each port of a multiport PD system is associated with a controller, and one controller is assigned a role to be a master controller and the remaining controllers are assigned as slave controllers. In another embodiment, each controller of a multiport PD system may be associated with a set of two or more ports and one controller is assigned a role to be a master controller and the remaining controllers are assigned as slave controllers. In another embodiment, a multiport PD system may have a single controller associated with a set of two or more ports, and the single controller is assigned as a master controller, and is configured to allocate power among the set of two or more ports. In some embodiments, the master controller initiates a master FSM and the master controller communicates with the slave controllers over a communication interface to initiate a slave FSM. Once each port has been assigned a role, a system power (SP) and a port budget or port power (PB) are configured (block 704). The system power is a total power that may be output by the multiport PD system. The port power is a maximum power that can be supplied by any given port. The processing logic at block 706 checks if a controller is the master controller or a slave controller.

If the controller is a slave controller, the processing logic registers a slave firmware routine to receive master commands (block 708). The slave firmware routine may be stored on a slave controller associated with the slave port. Once the processing logic registers the slave routine, the processing logic sends an event to the master controller (block 710). An event, as described herein, can be a sub-state within a state. The firmware routine can execute different operations within a state based on the current event value. The event may be a SLAVE FW_READY event to inform the master controller that the slave firmware routine is stored on the slave controller and that the slave controller is ready to communicate with the master controller. In block 712, the processing logic initiates the slave controller in a defined state. The processing logic can initiate the slave controller by sending an event, such as EVT_RUNNING and by setting the state. In one embodiment, the state is set to WAIT_FOR_ATTACH, such as described in reference to FIG. 4. Once the slave controller is initiated, the processing logic can run a load sharing slave FSM. In one embodiment, the load sharing slave FSM is the FSM 400 of FIG. 4. At point B 716 the slave controller can respond to commands from the master controller, as described in further detail in reference FIG. 8 and FIG. 9.

If, in block 706, the processing logic determines that the controller is a master controller, the processing logic can create an event to initialize the master controller by creating an event and setting a state of the master controller (block 718). The event may be an EVT_POLL_SLAVE event and the state of the master controller is set to DETERMINE_PORT_CONNECT_STATUS, such as described in reference to FIG. 5. Once the master controller is initiated, the processing logic runs a load sharing master FSM (block 720). In one embodiment, the load sharing master FSM is the FSM 500 of FIG. 5. At point A 722 the master controller is in operation and may perform actions as described by FIG. 2 and FIG. 3. The point A 722 may be the same as the point A 202 of FIG. 2.

Figure 8:
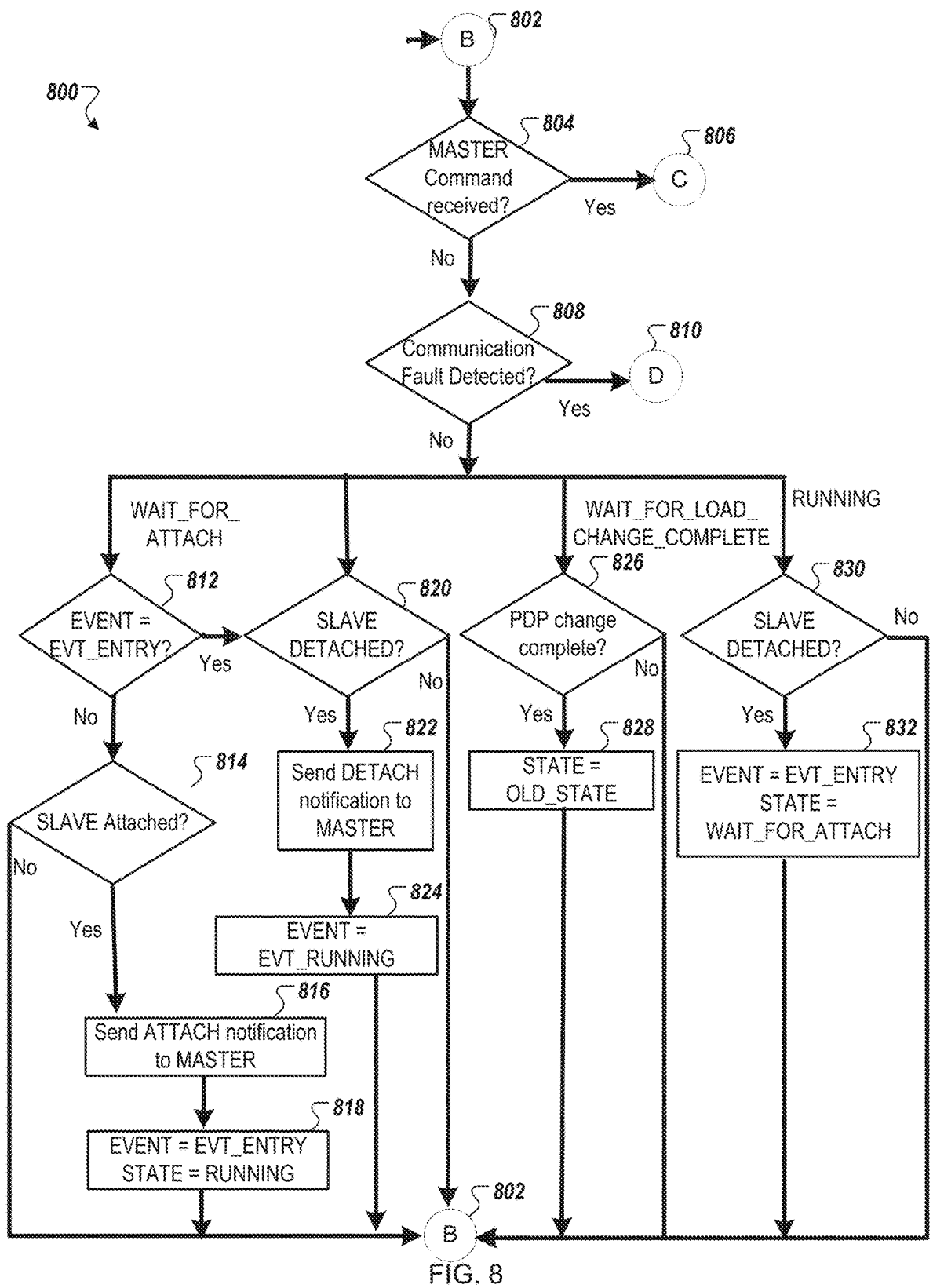
FIG. 8 is a flow diagram of a method of a slave controller operation according to one embodiment.

FIG. 8 is a flow diagram of a method 800 of a slave controller operation according to one embodiment. The method 800 may be performed by processing logic that comprises hardware (e.g., circuitry, dedicated logic, programmable logic, microcode, etc.), software, firmware, or a combination thereof. In one embodiment, the method 800 may be performed by any of the processing devices described herein. In one embodiment, the method 800 is performed by processing logic of a slave controller such as LS slave controller 114 of FIG. 1. In one embodiment, the slave controller executes a firmware-based method that performs the following operations. In another embodiment, the slave controller has embedded code or logic and is configured to execute instructions to perform the following operations.

Referring back to FIG. 8, the method 800 begins at point B 802 which may occur after initialization of the slave controller as described in FIG. 7. The point B 802 may be the point B 716 of FIG. 7. The slave controller is associated with a slave port. If the slave controller receives a command from a master controller (block 804), such as LS master controller 112 of FIG. 1, then it can implement a method at point C 806 to respond to the command. The method at point C is described in further detail in reference to FIG. 9. If the slave controller detects a communication fault (block 808), then it can implement a method at point D 810 to handle the communication fault. If the slave controller does not receive a command from the master controller and does not detect a communication fault, the slave controller may be in one of three states of operation.

In one embodiment, the slave controller is in a first state, WAIT_FOR_ATTACH, when the slave port is unattached (there is no sink device connected to the slave port). In the first state, the slave controller waits for a sink device to be connected and for the slave port to subsequently become attached. The slave controller detects a first event (EVT_ENTRY) (block 812). If the first event is EVT_ENTRY, then the slave controller checks if the slave port is attached (block 814). If the slave port is not attached, the slave controller returns to a previously running state at point B 802. If the slave port is attached, the slave controller sends a first notification (an ATTACH notification) to the master controller (block 816) to inform the master controller that the slave port is attached. The slave controller creates a second event (EVT_RUNNING) (block 818) and changes its current state (STATE) to RUNNING.

Returning to block 812, if the first event is not EVT_ENTRY, the slave controller can check if the slave port is detached (block 820). If the slave port is not detached, the slave controller can return to a previously running state at point B 802. If the slave port is detached, the slave controller can send a second notification (a DETACH notification) to the master controller (block 822) to inform the master controller that the slave port is detached. The slave controller can create the second event (EVT_RUNNING) (block 824).

In another embodiment, the slave controller is in a second state, WAIT_FOR_LOAD_CHANGE_COMPLETE, when the slave controller receives a command from the master controller to update or change a PDP of the slave port. The slave controller is in the second state when a PDP change of the slave port is in progress. The slave controller updates the PDP of the slave port, and subsequently checks if the PDP change is complete (block 826). If the PDP change is not complete, the slave controller returns to the previously running state at point B 802. If the PDP change is complete, the slave controller updates its current state (STATE) to its old state (OLD_STATE) (block 828).

In another embodiment, the slave controller is in a third state, RUNNING. The slave controller is in the third state when the slave port is attached, and no PDP change of the slave port is in progress. The slave controller checks is the slave port is detached (block 830). If the slave port is not detached, the slave port returns to the previously running state at point B 802. If the slave port is detached, the slave controller creates a third event (EVT_ENTRY) and changes its state to the first state (WAIT_FOR_ATTACH) (block 832).

Figure 9:
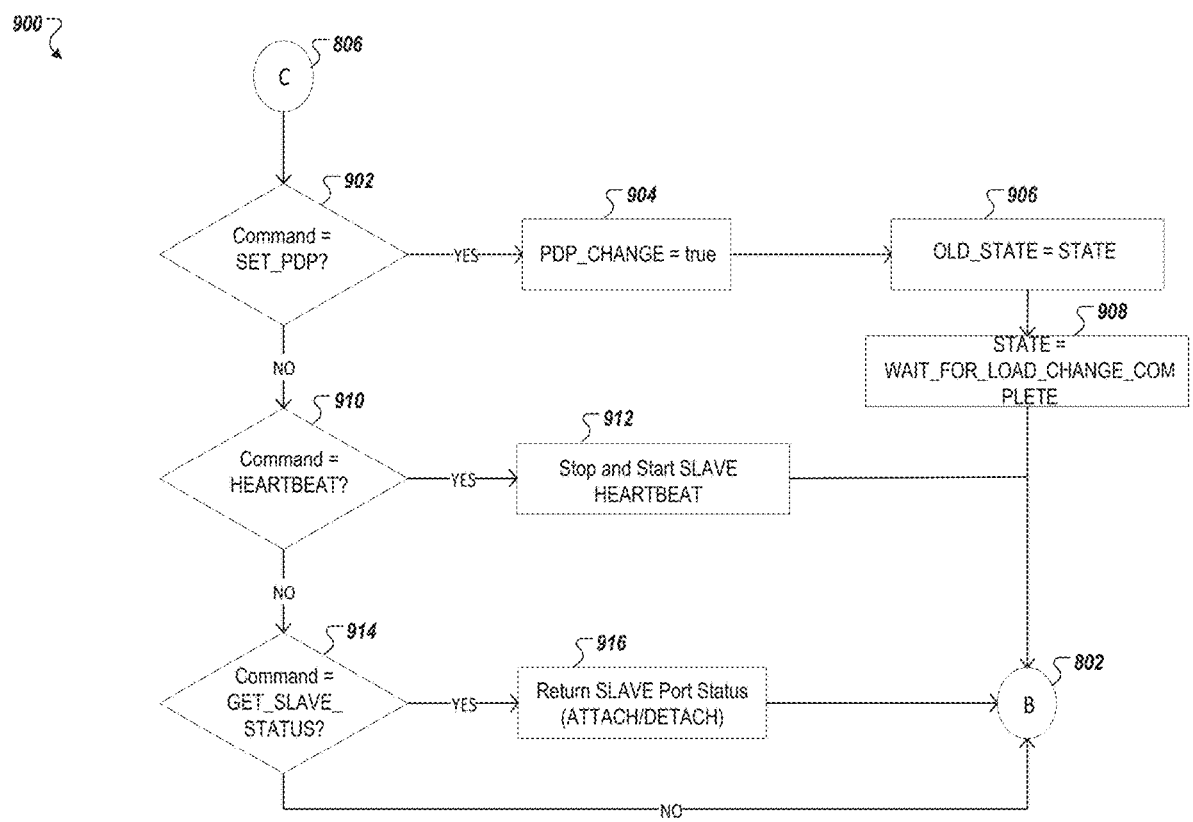
FIG. 9 is a flow diagram of a method of slave controller command handling according to one embodiment.

FIG. 9 is a flow diagram of a method 900 of slave controller command handling according to one embodiment. The method 900 may be performed by processing logic that comprises hardware (e.g., circuitry, dedicated logic, programmable logic, microcode, etc.), software, firmware, or a combination thereof. In one embodiment, the method 900 is performed by processing logic of a slave controller such as LS slave controller 114 of FIG. 1. In one embodiment, the slave controller executes a firmware-based method that performs the following operations. In another embodiment, the slave controller has embedded code or logic and is configured to execute instructions to perform the following operations. The method 900 may be implemented when the slave controller receives a command from a master controller, such as LS master controller 112 of FIG. 1.

The method 900 begins at point C 806 when the slave controller receives a command from a master controller. The point C 806 is the same the point C 806 of FIG. 8. At block 804 of FIG. 8, the slave controller determines that it received a command from the master controller. At block 902, the slave controller determines if the command is a first command (e.g., SET PDP) to change or update a PDP of a slave port associated with the slave controller. If the command is a first command to change or update the PDP of the slave port, the slave controller sets a PDP change variable (PDP_CHANGE) to true (block 904). The PDP change variable may be a binary value such as true/false, zero/one, or the like. The slave controller updates its old state (OLD_STATE) to its current state (STATE) (block 906). The slave controller updates its current state (STATE) to WAIT_FOR_LOAD_CHANGE_COMPLETE (block 908). The WAIT_FOR_LOAD_CHANGE_COMPLETE state may be the second state as described in reference to FIG. 8. The slave controller returns to a previously running state at point B 802.

At block 902, if the slave controller determines that the command is not the first command to change or update the PDP of the slave port, the slave controller can check if the command is a second command (e.g., HEARTBEAT) (block 910) that the master controller sends to detect a communication fault between the master controller and the slave controller. The second command may be a heartbeat message from the master controller. If the slave controller determines that the command is the heartbeat message, the slave controller stops and starts a slave heartbeat (block 912). The slave heartbeat is an acknowledgement that the slave controller sends to the master controller to acknowledge that the slave controller received the heartbeat message. The slave controller returns to the previously running state at point B 802. In one embodiment, the master controller sends a heartbeat message at regular predefined intervals of time (tHeartBeat). The intervals of time may be a duration in seconds at which the master controller transmits heartbeat messages. Alternatively, tHeartBeat can be other amounts of time. If the slave controller does not receive a heartbeat message in a threshold amount of time (tCommunicationFailure), the slave controller determines that there is a communication failure with the master controller. If the master controller does not receive a heartbeat acknowledgement from the slave controller in the threshold amount of time, the master controller determines that there is a communication failure with the slave controller. Once the communication failure is detected, both the master controller and the slave controller can update the PDP of their respective ports to a fair share value, if the PDP of their respective ports was previously greater than the fair share value.

At block 910, if the slave controller determines that the command is not a heartbeat message from the master controller, the slave controller checks if the command is a third command (e.g., GET SLAVE STATUS) (block 914) that the master controller sends to obtain a port connection status of the slave port. The third command may be received by the slave controller when the master controller queries the slave controller for the port connection status of the slave port. If the slave controller determines that the command is the third command, the slave controller notifies the master controller of the port connection status of the slave port (block 916). The slave controller can notify the master controller of the port connection status by returning a SLAVE port status. The slave port status can be either ATTACH or DETACH, if a sink device is connected or not connected to the slave port respectively. If the slave controller determines in block 914 that the command is not the third command, the slave controller returns to the previously running state at point B 802.

Figure 10:
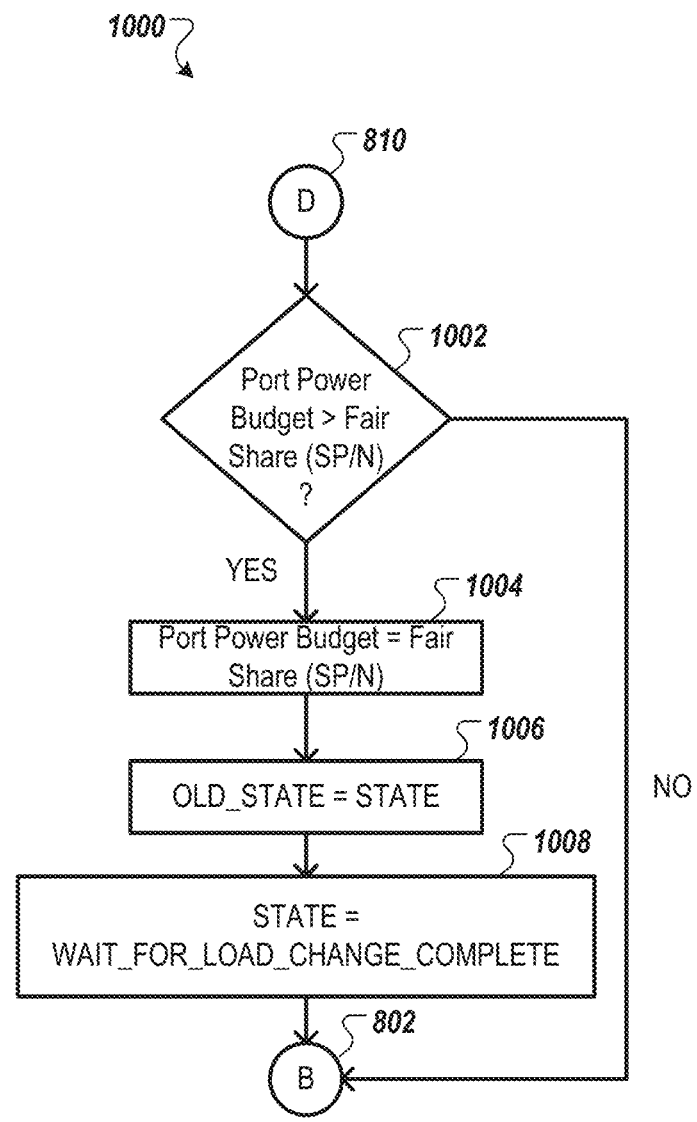
FIG. 10 is a flow diagram of a method of slave controller communication fault handling according to one embodiment.

FIG. 10 is a flow diagram of a method 1000 of slave controller communication fault handling according to one embodiment. The method 1000 may be performed by processing logic that comprises hardware (e.g., circuitry, dedicated logic, programmable logic, microcode, etc.), software, firmware, or a combination thereof. In one embodiment, the method 1000 may be performed a slave controller such as LS slave controller 114 of FIG. 1. In one embodiment, the slave controller executes a firmware-based method that performs the following operations. In another embodiment, the slave controller has embedded code or logic and is configured to execute instructions to perform the following operations. The method 1000 may be implemented when the slave controller determines that there is a communication fault between the slave controller and a master controller, such as LS master controller 112 of FIG. 1.

The method 1000 begins at point D 810 when the slave controller determines that there is a communication fault between the slave controller and the master controller. The point D 810 is the same the point D 810 of FIG. 8. At block 808 of FIG. 8, the slave controller determines that there is a communication fault. Once the communication fault is detected, the slave controller can check if a PDP of a slave port associated with the slave controller is greater than a fair share PDP value (block 1002). The fair share PDP value is equal to a total system power (SP) divided by a total number (N) of ports (e.g., SP/N). The total number of ports includes the master port and each slave port. In one embodiment, the total number of ports is two, and the slave controller checks if the PDP value of the slave port is greater than 50% of the total system power. In other embodiments, the total number of ports is greater than two, and the slave controller checks if the PDP value of the slave port is greater than SP/N.

If in block 1002, if the slave controller determines that the PDP of the slave port is greater than the fair share PDP value, the slave controller reduces the PDP value to the fair share PDP value (block 1004). In one embodiment, the total number of ports is two and the slave controller reduces the PDP value of the slave port to 50% of the total power. In other embodiments, the total number of ports is greater than two, and the slave controller reduces the PDP value of the slave port to SP/N. In another embodiment, the total number of ports is two and the slave controller reduces the PDP value of the slave port to SP/2. In block 1006, the slave controller updates its old state (OLD_STATE) to its current state (STATE). The slave controller updates its current state (STATE) to WAIT_FOR_LOAD_CHANGE_COMPLETE (block 1008). The WAIT_FOR_LOAD_CHANGE_COMPLETE state may be the second state as described in reference to FIG. 8. The slave controller returns to a previously running state at point B 802. Returning to block 1002, if the slave controller determines that the PDP of the slave port is less than the fair share PDP value, the slave controller takes no additional action and returns to the previously running state at point B 802.

Figure 11A:
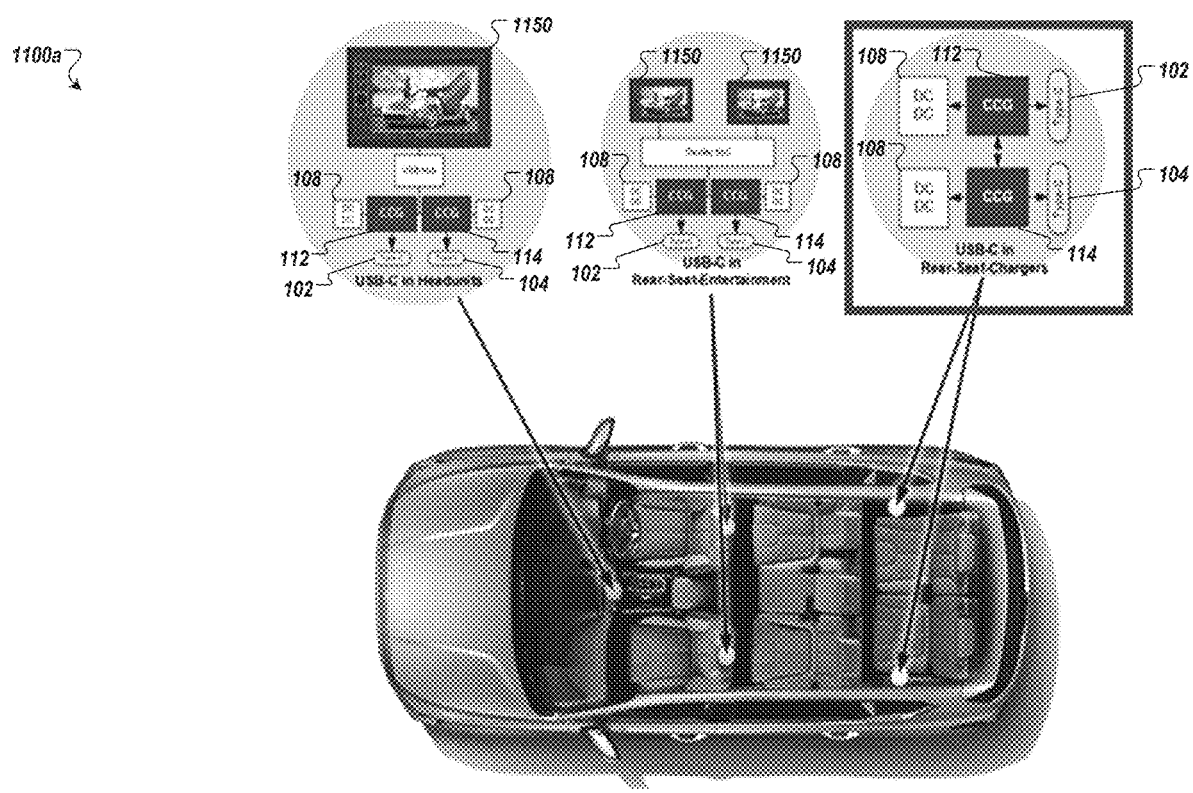
FIG. 11A is a block diagram of various multiport power adapters 1100*a* configured to dynamically and intelligently distribute power among ports using a firmware-based method according to one embodiment.

FIG. 11A is a block diagram of various multiport power adapters 1100a configured to dynamically and intelligently distribute power among ports using a firmware-based method according to one embodiment. The multiport power adapter 1100a may be similar to the multiport PD system 100 of FIG. 1, as noted by similar reference numbers. The multiport power adapter 1100a includes one master port 102 and one or more slave ports 104. The master port 102 can be controlled by a master controller 112. The slave ports 104 can be controlled by corresponding slave controllers 114. Power converters 108 convert an input voltage to a different voltage. In the depicted embodiment, power converters 108 are DC-DC power converters. In one embodiment, the multiport power adapter 1100a is a multiport USB-C automotive rear-seat charger of an automobile. In another embodiment, multiport power adapter 1100 is part of a rear-seat entertainment system of an automobile. A rear-seat entertainment system can include a display system on chip (SoC), and one or more displays, or other power consuming devices, can be connected to the display SoC. In another embodiment, multiport power adapter 1100 is part of a headunit of an automobile. The headunit of the automobile can include a USB hub and a power consuming device can be connected to the USB hub. Power consuming devices can consume power from the same power source as master port 102 and slave ports 104, or power consuming devices can consume power from a different source. In the case where power consuming devices consume power from the same source as master port 102 and slave ports 104, the firmware-based method can dynamically and intelligently allocate power between each of the master port 102, the slave ports 104, and the power consuming devices.

In other embodiments, multiport power adapter 1100a can be part of a multiport USB-C charger in a vehicle, car, truck, van, boat, plane, building, house, or the like. In other embodiments, multiport power adapter 1100 is a multiport USB-C wall charger, a multiport USB-C power bank, a multiport USB-C power hub, a shared multiport power adapter, or the like. In other embodiments, multiport power adapter 1100a may use ports other than USB-C ports, and is a multiport wall charger, a multiport power hub, a multiport power bank, or the like. In other embodiments, the multiport power adapter 1100a may use ports other than USB-C, such as wall outlets, Micro-USB ports, or the like. In some embodiments, ports of the multiport USB-C power adapter 1100a may not be all the same. For example the multiport USB-C power adapter may include a number of USB Type-C ports and a number of other ports, such as USB-A, Micro-USB, and USB-A 3.0 ports.

The firmware-based method may be implemented by the multiport power adapter 1100a to dynamically share a total system power among connected USB-C/PD charging ports or multiport USB-C/PD controllers by sensing a power requirement of connected sink devices. The multiport power adapter allocates available power between ports, independent of the order that the ports are connected. In some embodiments, the multiport power adapter 1100a may include additional power sinks or power consuming devices 1150, such as a video display, an audio output, or the like. In some embodiments, the firmware-based method can be applied to any distribution of resources.

Figure 11B:
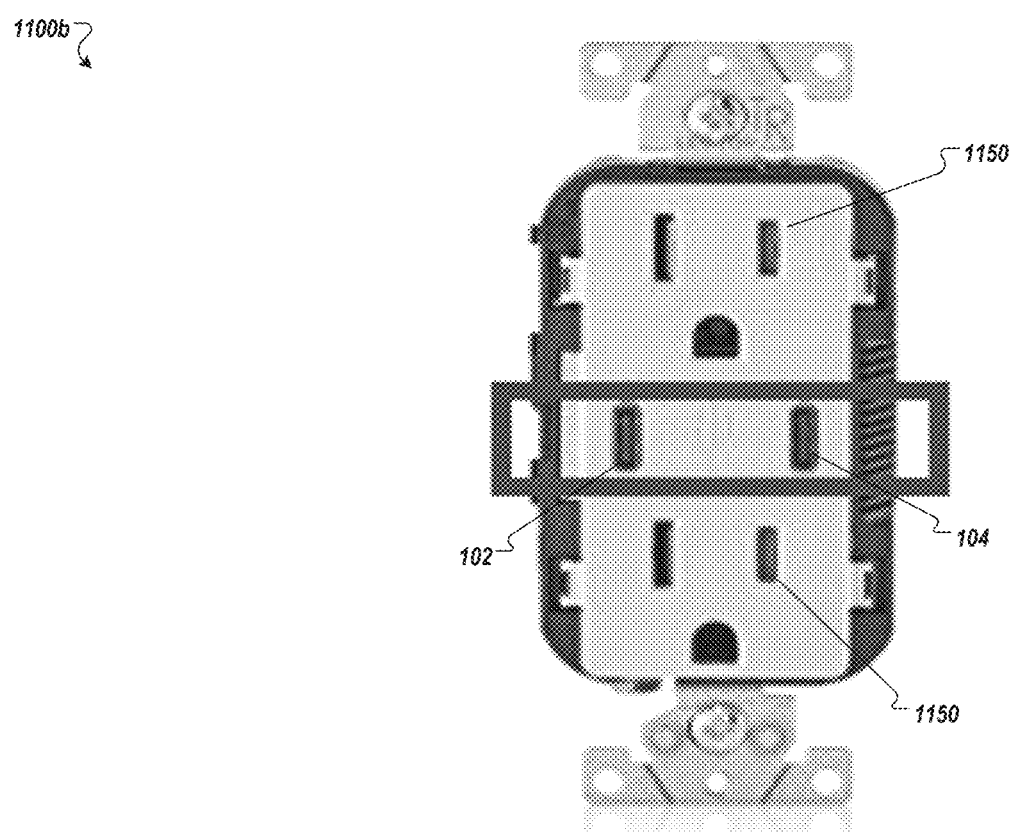
FIG. 11B is an illustration of a multiport AC power adapter 1100*b* configured to dynamically and intelligently distribute power using a firmware-based method according to one embodiment.

FIG. 11B is an illustration of a multiport AC power adapter 1100b configured to dynamically and intelligently distribute power using a firmware-based method according to one embodiment. In one embodiment, multiport AC power adapter 1100b can be a wall power adapter that includes a master port 102, a slave port 104, and power ports 1150. The master port 102 can be controlled by a master controller (not shown in FIG. 11B), and the slave port 104 can be controlled by a slave controller (not shown in FIG. 11B). AC-DC converters (not shown) can convert an input AC supply voltage to a DC voltage to be supplied to the master controller and the slave controller. In one embodiment, multiport AC power adapter 1100b can be configured to implement operations to distribute a system power between the master port 102 and the slave port 104 while each port 1150 can supply a fixed port power. In other embodiments, the ports 1150 can be configured as slave ports, and multiport AC power adapter 1100b can be configured to implement operations to distribute a system power between the master port 102, the slave port 104, and the ports 1150.

Although illustrated as a wall adapter in FIG. 11B, the multiport AC power adapter 1100b can be another type of multiport AC power adapter, such as could be found in a vehicle, car, truck, van, boat, plane, building, house, or the like.

Figure 12:
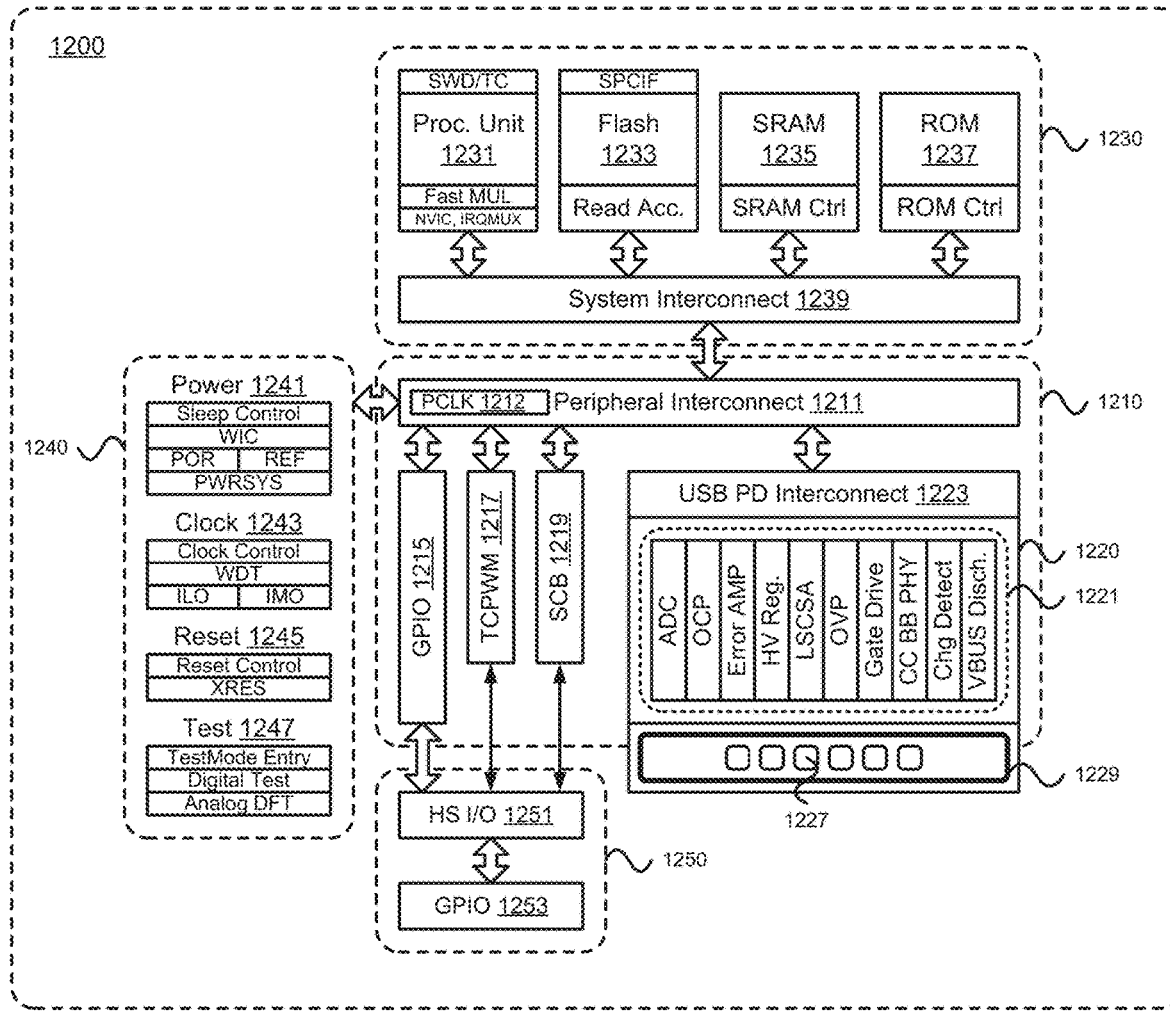
FIG. 12 is a block diagram illustrating a system for a USB device for use in USB power delivery in accordance with some embodiments.

FIG. 12 is a block diagram illustrating a system 1200 for a USB device for use in USB power delivery in accordance with some embodiments. System 1200 may include a peripheral subsystem 1210 including a number of components for use in USB Power Delivery (USB-PD). Peripheral subsystem 1210 may include a peripheral interconnect 1211 including a clocking module, peripheral clock (PCLK) 1212 for providing clock signals to the various components of peripheral subsystem 1210. Peripheral interconnect 1211 may be a peripheral bus, such as a single-level or multi-level advanced high-performance bus (AHB), and may provide a data and control interface between peripheral subsystem 1210, CPU subsystem 1230, and system resources 1240. Peripheral interconnect 1211 may include controller circuits, such as direct memory access (DMA) controllers, which may be programmed to transfer data between peripheral blocks without input by, control of, or burden on CPU subsystem 1230.

The peripheral interconnect 1211 may be used to couple components of peripheral subsystem 1210 to other components of system 1200. Coupled to peripheral interconnect 1211 may be a number of general purpose input/outputs (GPIOs) 1215 for sending and receiving signals. GPIOs 1215 may include circuits configured to implement various functions such as pull-up, pull-down, input threshold select, input and output buffer enabling/disable, single multiplexing, etc. Still other functions may be implemented by GPIOs 1215. One or more timer/counter/pulse-width modulator (TCPWM) 1217 may also be coupled to the peripheral interconnect and include circuitry for implementing timing circuits (timers), counters, pulse-width modulators (PWMs) decoders, and other digital functions that may operate on I/O signals and provide digital signals to system components of system 1200. Peripheral subsystem 1210 may also include one or more serial communication blocks (SCBs) 1219 for implementation of serial communication interfaces such as I2C, serial peripheral interface (SPI), universal asynchronous receiver/transmitter (UART), controller area network (CAN), clock extension peripheral interface (CXPI), etc.

For USB power delivery applications, peripheral subsystem 1210 may include a USB power delivery subsystem 1220 coupled to the peripheral interconnect and comprising a set of USB-PD modules 1221 for use in USB power delivery. USB-PD modules 1221 may be coupled to the peripheral interconnect 1211 through a USB-PD interconnect 1223. USB-PD modules 1221 may include an analog-to-digital conversion (ADC) module for converting various analog signals to digital signals; an error amplifier (AMP) regulating the output voltage on VBUS line per a PD contract; a high-voltage (HV) regulator for converting the power source voltage to a precise voltage (such as 3.5-5V) to power system 1200; a low-side current sense amplifier (LSCSA) for measuring load current accurately, an over voltage protection (OVP) module and an over-current protection (OCP) module for providing over-current and over-voltage protection on the VBUS line with configurable thresholds and response times; one or more gate drivers for external power field effect transistors (FETs) used in USB power delivery in provider and consumer configurations; and a communication channel PHY (CC BB PHY) module for supporting communications on a Type-C communication channel (CC) line. USB-PD modules 1221 may also include a charger detection module for determining that a charging circuit is present and coupled to system 1200 and a VBUS discharge module for controlling discharge of voltage on VBUS. The discharge control module may be configured to couple to a power source node on the VBUS line or to an output (power sink) node on the VBUS line and to discharge the voltage on the VBUS line to the desired voltage level (i.e., the voltage level negotiated in the PD contract). USB power delivery subsystem 1220 may also include pads 1227 for external connections and electrostatic discharge (ESD) protection circuitry 1229, which may be required on a Type-C port. USB-PD modules 1221 may also include a bi-directional communication module for supporting bi-directional communications with another controller, such as between a primary-side controller and a secondary-side controller of a flyback converter.

GPIO 1215, TCPWM 1217, and SCB 1219 may be coupled to an input/output (I/O) subsystem 1250, which may include a high-speed (HS) I/O matrix 1251 coupled to a number of GPIOs 1253. GPIOs 1215, TCPWM 1217, and SCB 1219 may be coupled to GPIOs 1253 through HS I/O matrix 1251.

System 1200 may also include a central processing unit (CPU) subsystem 1230 for processing commands, storing program information, and data. CPU subsystem 1230 may include one or more processing units 1231 for executing instructions and reading from and writing to memory locations from a number of memories. Processing unit 1231 may be a processor suitable for operation in an integrated circuit (IC) or a system-on-chip (SOC) device. In some embodiments, processing unit 1231 may be optimized for low-power operation with extensive clock gating. In this embodiment, various internal control circuits may be implemented for processing unit operation in various power states. For example, processing unit 1231 may include a wake-up interrupt controller (WIC) configured to wake the processing unit up from a sleep state, allowing power to be switched off when the IC or SOC is in a sleep state. CPU subsystem 1230 may include one or more memories, including a flash memory 1233, and static random access memory (SRAM) 1235, and a read-only memory (ROM) 1237. Flash memory 1233 may be a non-volatile memory (NAND flash, NOR flash, etc.) configured for storing data, programs, and/or other firmware instructions. Flash memory 1233 may include a read accelerator and may improve access times by integration within CPU subsystem 1230. SRAM 1235 may be a volatile memory configured for storing data and firmware instructions accessible by processing unit 1231. ROM 1237 may be configured to store boot-up routines, configuration parameters, and other firmware parameters and settings that do not change during operation of system 1200. SRAM 1235 and ROM 1237 may have associated control circuits. Processing unit 1231 and the memories may be coupled to a system interconnect 1239 to route signals to and from the various components of CPU subsystem 1230 to other blocks or modules of system 1200. System interconnect 1239 may be implemented as a system bus such as a single-level or multi-level AHB. System interconnect 1239 may be configured as an interface to couple the various components of CPU subsystem 1230 to each other. System interconnect 1239 may be coupled to peripheral interconnect 1211 to provide signal paths between the components of CPU subsystem 1230 and peripheral subsystem 1210.

System 1200 may also include a number of system resources 1240, including a power module 1241, a clock module 1243, a reset module 1245, and a test module 1247. Power module 1241 may include a sleep control module, a wake-up interrupt control (WIC) module, a power-on-reset (POR) module, a number of voltage references (REF), and a PWRSYS module. In some embodiments, power module 1241 may include circuits that allow system 1200 to draw and/or provide power from/to external sources at different voltage and/or current levels and to support controller operation in different power states, such as active, low-power, or sleep. In various embodiments, more power states may be implemented as system 1200 throttles back operation to achieve a desired power consumption or output. Clock module 1243 may include a clock control module, a watchdog timer (WDT), an internal low-speed oscillator (ILO), and an internal main oscillator (IMO). Reset module 1245 may include a reset control module and an external reset (XRES) module. Test module 1247 may include a module to control and enter a test mode as well as testing control modules for analog and digital functions (digital test and analog DFT).

System 1200 may be implemented in a monolithic (e.g., single) semiconductor die. In other embodiments, various portions or modules of system 1200 may in implemented on different semiconductor dies. For example, memory modules of CPU subsystem 1230 may be on-chip or separate. In still other embodiments, separate-die circuits may be packaged into a single multi-chip module, or remain separate and disposed on a circuit board (or in a USB cable connector) as separate elements.

System 1200 may be implemented in a number of application contexts to provide USB-PD functionality thereto. In each application context, an IC controller or SOC implementing system 1200 may be disposed and configured in an electronic device (e.g., a USB-enabled device) to perform operations in accordance with the techniques described herein. In one example embodiment, a system 1200 may be disposed and configured in a personal computer (PC) power adapter for a laptop, a notebook computer, etc. In another example embodiment, system 1200 may be disposed and configured in a power adapter (e.g., a wall charger) for a mobile electronic device (e.g., a smartphone, a tablet, etc.). In another example embodiment, system 1200 may be disposed and configured in a wall socket that is configured to provide power over USB Type-A and/or Type-C port(s). In another example embodiment, system 1200 may be disposed and configured in a car charger that is configured to provide power over USB Type-A and/or Type-C port(s). In yet another example embodiment, system 1200 may be disposed and configured in a power bank that can get charged and then provide power to another electronic device over a USB Type-A or Type-C port. In other embodiments, a system like system 1200 may be configured with the power switch gate control circuitry described herein and may be disposed in various other USB-enabled electronic or electromechanical devices.

It should be understood that a system, like system 1200 implemented on or as an IC controller may be disposed into different applications, which may differ with respect to the type of power source being used and the direction in which power is being delivered. For example, in the case of a car charger, the power source is a car battery that provides DC power, while in the case of a mobile power adapter the power source is an AC wall socket. Further, in the case of a PC power adapter the flow of power delivery is from a provider device to consumer device, while in the case of a power bank the flow of power delivery may be in both directions depending on whether the power bank is operating as a power provider (e.g., to power another device) or as a power consumer (e.g., to get charged itself). For these reasons, the various applications of system 1200 should be regarded in an illustrative rather than a restrictive sense.

Figure 13:
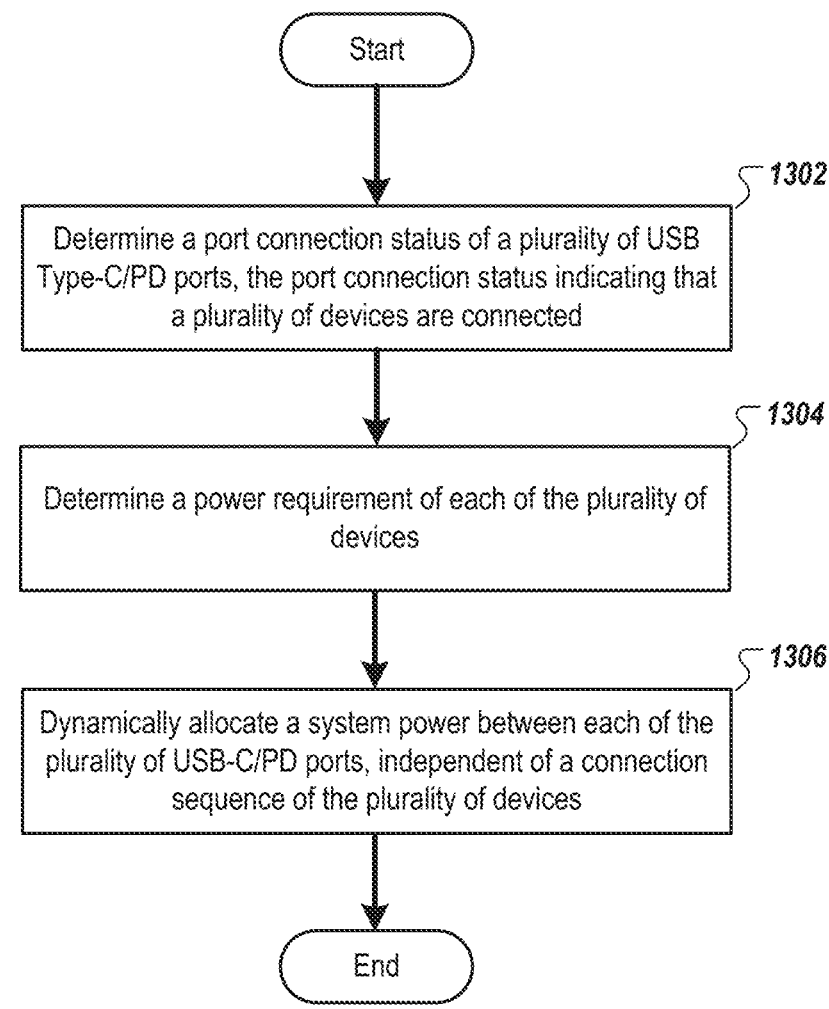
FIG. 13 is a flow diagram of a method of dynamically allocating a total system power among ports according to one embodiment.

FIG. 13 is a flow diagram of a method 1300 of dynamically allocating a total system power among ports according to one embodiment. The method 1300 may be performed by processing logic that comprises hardware (e.g., circuitry, dedicated logic, programmable logic, microcode, etc.), software, firmware, or a combination thereof. In one embodiment, the method 1300 may be performed by any of the processing devices described herein. In one embodiment, the method 1300 is performed by processing logic of a controller such as LS master controller 112 of FIG. 1. In another embodiment, the method 1300 is performed by processing logic of a controller such as LS slave controller 114 of FIG. 1. In one embodiment, the controller executes a firmware-based method that performs the following operations. In another embodiment, the controller has embedded code or logic and is configured to execute instructions to perform the following operations. In some embodiments, the operations of method 1300 can be distributed between the master controller and the slave controller.

Referring back to FIG. 13, the method 1300 begins by the processing logic determining a port connection status of each USB-C/PD port (block 1302) of a multiport PD system. The port connection status indicates a number of devices that are connected. The processing logic determines a power requirement of each of the devices (block 1304). The processing logic dynamically allocates a system power between each of the USB-C/PD ports, independent of a connection sequence of the devices (block 1306), and the method 1300 ends.

In another embodiment, to dynamically allocate the system power, the processing logic determines an order for the devices. The processing logic allocates a fraction of the system power to each of the USB-C/PD ports in the order. The fraction is equal to the system power divided by a number of the USB-C/PD ports. After allocating the fraction to each of the USB-C/PD ports, the processing logic determines an amount of unused power of the system power. The processing logic redistributes the amount of unused power to at least one of the USB-Type-C/PD. In one embodiment, the processing logic redistributes the amount of unused power among ports connected to a device with a power requirement (or requested power) that is larger than the fraction.

In one embodiment, the order is a descending order of the power requirements for the devices. In other embodiments, the order can be a random order of the devices, an order in which the devices were connected, or another order.

In another embodiment, to determine the power requirement of each of the devices, the processing logic determines a first power requirement of a first device connected to a first USB-C/PD port and a second power requirement of a second device connected to a second USB-C/PD port. In one embodiment, the processing logic determines that the second power requirement is less than the first power requirement. The processing logic allocates half of the system power to the first USB-C/PD port and half of the system power to the second USB-C/PD port. The processing logic determines a residual amount of power as a difference between half of the system power and the second power requirement and allocates the residual amount of power to the first USB-C/PD port in addition to the half of the system power already allocated to the first USB-C/PD port. In other embodiments, the processing logic may allocate a fraction of the residual amount of power to the USB-C/PD port in addition to the first USB-C/PD port.

In another embodiment, the processing logic determines a change in the port connection status of one or more of the USB-C/PD ports. In one embodiment, the change in the port connection status indicates that no devices are connected to any of the USB-C/PD ports. In one embodiment, the processing logic is initialized with no devices connected to any of the USB-C/PD ports, and the processing logic allocates a portion of the system power to each of the USB-C/PD ports responsive to the change in the port connection status. In one embodiment, the portion is equal to the system power divided by a number of USB-C/PD ports. Alternatively, the portion can be equal to a fraction of the total system power, and each portion can be a different fraction of the total system power, that when summed equals the total system power. In another embodiment, the change in the port connection status indicates that a device that was connected to a USB-C/PD port has been disconnected, and there are no devices connected to any of the USB-C/PD port. The processing logic allocates the portion of the system power to each of the USB-C/PD ports in order of ports with a highest power budget to ports with a lowest power budget, responsive to the change in the port connection status.

In another embodiment, the change in the port connection status indicates that only a first device is connected to a first USB-C/PD port. The processing logic allocates an amount of the system power to the first USB-C/PD port. In one embodiment, the amount is equal to a first power requirement of the first device. In another embodiment, the amount may be greater than the first power requirement of the first device. In another embodiment, the amount may be less than the first power requirement of the first device, but greater than a fair share fraction, the fair share fraction being equal to the system power divided by the number of USB-C/PD ports. The processing logic determines a residual power that is equal to the difference between the system power and the amount of power (that is allocated to the first USB-C/PD port). The processing logic allocates a fraction of residual power, equal to the residual power divided by a number of unconnected USB-C/PD ports, to each of the unconnected USB-C/PD ports, responsive to the change in the port connection status. Alternatively, the processing logic allocates a portion of the residual power. The portion can be equal to a fraction of the residual power, and each portion can be a different fraction of the total system power, that when summed equals the residual power. The processing logic allocates the fraction of the residual power to each of the USB-C/PD ports in order of ports with a highest power budget to ports with a lowest power budget, responsive to the change in the port connection status.

In another embodiment, the change in the port connection status indicates that a subset of the number of devices is connected to a subset of the number of USB-C/PD ports. The subset of the number of devices is more than one device. The processing logic determines an order for the subset of the number of devices. The processing logic allocates a fraction of the system power, equal to the system power divided by a number of the USB-C/PD ports, to each of the USB-C/PD ports in the order. Alternatively, the processing logic allocates a portion of the system power. The portion can be equal to a fraction of the system power, and each portion can be a different fraction of the system power, that when summed equals the residual power. The processing logic determines an amount of unused power of the system power after allocating the fraction to each of the USB-C/PD ports. The processing logic redistributes the amount of unused power to at least one of the number of USB-C/PD ports.

In one embodiment, the order is a descending order of the power requirements for the subset of the number of devices. In other embodiments, the order can be a random order of the subset of the number of devices, an order in which the subset of the number of devices were connected, or another order.

In another embodiment, the processing logic determines whether the change in the port connection status is valid. The processing logic determines whether the change in the port connection status remains consistent through a specified duration of time. If the change in the port connection status does not remain consistent during the specified duration of time, the processing logic ignores the change in the port connection status. If the port connection status remains consistent during the specified duration of the time, the processing logic reallocates the system power between each of the USB-C/PD ports.

In another embodiment, the processing logic detects a communication fault between a first controller and a second controller. In one embodiment the processing logic may be processing logic of the first controller. In another embodiment, the processing logic may be processing logic of the second controller. The processing logic performs a power budget reduction in response to a detection of the communication fault. The processing logic performs the power budget reduction by allocating a fraction of the system power to a subset of the USB-C/PD ports. The fraction is equal to the system power divided by a number of the USB-C/PD ports. In one embodiment, the processing logic allocates the fraction to each of the USB-C/PD ports. In another embodiment, the processing logic allocates the fraction to the first controller and the second controller. In one embodiment, the processing logic only allocates the fraction to the first controller if the first controller previously had a power allocation that was greater than the fraction, and the processing logic only allocates the fraction to the second controller if the second controller previously had a power allocation that was greater than the fraction.

In another embodiment, the processing logic determines a load sharing role of a controller coupled to a first port of the USB-C/PD ports. The load sharing roll can be either master or slave. In one embodiment, the processing logic determines the load sharing role of the controller as master. The processing logic polls for one or more slaves over a communication interface and initiates a master finite state machine. Each of the one or more slaves is an additional controller coupled to one of the USB-C/PD ports. In another embodiment, the processing logic determines the load sharing role of the controller as slave. The processing logic registers the controller with the master over the communication interface to receive master commands. The processing logic initiates a slave finite state machine. The master is a second controller coupled to a second port.

In one embodiment, when the load sharing role of the controller is slave, the processing logic determines whether a master command has been received from the master. The master command is at least one of a first command that sets a power deliver power (PDP) for a first port coupled to the controller, a second command that starts or stops a heartbeat signaling between the slave and the mater over the communication interface, or a third command that provides a port connection status of the first port to the master. The processing logic determines whether a communication fault has occurred between the master and the slave over the communication interface. If the processing logic determines that a communication fault has occurred between the master and the slave over the communication interface, the processing logic adjusts a slave power budget for the first port to a fair share allocation if the slave power budget is greater than the fair share allocation. If the slave power budget is less than the fair share allocation, the processing logic does not adjust the slave power budget. The processing logic monitors for a change in the port connection status of the first port, and if the processing logic detects a change in the port connection status of the first port, the processing logic reports the change to the master over the communication interface.

In another embodiment, when the load sharing role of the controller is master, the processing logic determines whether a communication fault has occurred between the master and the slave over the communication interface. If the processing logic determines that a communication fault has occurred, the processing logic adjusts a master power budget for a first port coupled to the controller to a fair share allocation if the master power budget is greater than the fair share allocation. If the master power budget is less than the fair share allocation, the processing logic does not adjust the master power budget. In one embodiment, the processing logic determines a port connection status of each of the USB-C/PD ports as indicating that more than one of the USB-C/PD ports is connected to a number of devices. The processing logic determines an order of power requirements for the number of devices and allocates a first fraction (or first portion) of the system power to each of the USB-C/PD ports in the order. The first fraction is equal to the system power divided by a number of the USB-C/PD ports. The processing logic redistributes an amount of unused power of the system power to one or more of the USB-C/PD ports after allocating the first fraction to each of the USB-C/PD ports, where the one or more of the USB-C/PD ports are coupled to one or more devices having a power requirement greater than the first fraction. The order can be a descending order of the power requirements for the devices. Alternatively, the order can be a random order of the devices, an order in which the devices were connected, or another order.

In another embodiment, the processing logic determines the port connection status of each of the USB-C/PD ports as indicating that only a first port of the is connected to a first device. The processing logic allocates an amount of the system power to the first port. In one embodiment, the amount is equal to a first power requirement of the first device. In another embodiment, the amount may be greater than the first power requirement of the first device. In another embodiment, the amount may be less than the first power requirement of the first device, but greater than a fair share fraction, the fair share fraction being equal to the system power divided by the number of USB-C/PD ports. The processing logic determines an order of power budgets for the number of USB-C/PD ports, and allocates a second fraction (or second portion) of a residual power, which is the difference between the system power and the first power requirement, to a remaining set of the USB-C/PD ports in the order. The second fraction is equal to the residual power divided by a number in the remaining set. The order can be a descending order of the power requirements for the devices. Alternatively, the order can be a random order of the devices, an order in which the devices were connected, or another order.

In another embodiment, the processing logic determines the port connection status of each of the USB-C/PD ports as indicating that no devices are connected to any of the USB-C/PD ports. The processing logic determines an order of power budgets for the USB-C/PD ports and allocates a first fraction of the system power to each of the USB-C/PD ports in the order. The first fraction is equal to the system power divided by a number of the USB-C/PD ports. The order can be a descending order of the power requirements for the devices. Alternatively, the order can be a random order of the devices, an order in which the devices were connected, or another order.

In the above description, some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "determining", "allocating," "dynamically allocating," "redistributing," "ignoring," "reallocating," "detecting," "performing," "polling," "registering," "monitoring," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an embodiment" or "one embodiment" throughout is not intended to mean the same embodiment or embodiment unless described as such.

Embodiments descried herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store one or more sets of instructions. The term "computer-readable medium" shall also be taken to include any medium that is capable of storing, encoding, or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The methods and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details such as examples of specific systems, components, methods, and so forth, in order to provide a good understanding of several embodiments of the present disclosure. It is to be understood that the above description is intended to be illustrative and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:
   determining, by a controller, a port connection status of a plurality of USB ports, the port connection status indicating that a plurality of devices are connected, wherein at least one of the plurality USB ports is a USB Type-C Power Delivery (USB-C/PD) port;
   determining, by the controller, a power requirement of each of the plurality of devices;
   dynamically allocating, by the controller, a system power between each of the plurality of USB ports, independent of a connection sequence of the plurality of devices;
   determining, by the controller, a change in the port connection status; reallocating, by the controller, the system power between each of the plurality of USB ports, responsive to the change in the port connection status remaining consistent during a specified duration of time, detecting, by the controller, a communication fault between the controller and another controller associated with power delivery to one of the plurality of USB ports; and performing, by the controller, a power budget reduction responsive to detection of the communication fault,
   wherein performing the power budget reduction comprises re-allocating a portion of the system power to each of the plurality of USB ports.

2. The method of claim 1, wherein dynamically allocating the system power comprises:
   determining, by the controller, an order of power requirements for the plurality of devices; and
   allocating, by the controller, a portion of the system power to each of the plurality of USB ports based on the power requirements.

3. The method of claim 1, wherein dynamically allocating the system power further comprises:
   determining, by the controller, an amount of unused power of the system power after allocating a portion of the system power to each of the plurality of USB ports; and
   redistributing, by the controller, the amount of unused power to at least one of the plurality of USB ports.

4. The method of claim 1, wherein determining the power requirement of each of the plurality of devices comprises:
   determining a first power requirement of a first device connected to a first USB port of the plurality of USB ports;
   determining a second power requirement of a second device connected to a second USB port of the plurality of USB ports, the second power requirement being less than the first power requirement;
   allocating half of the system power to the first USB port and half of the system power to the second USB port;
   determining a residual amount of power as a difference between the second power requirement and half of the system power; and
   allocating the residual amount of power to the first USB port.

5. The method of claim 1, further comprising:
   determining, by the controller, that the change in port connection status indicates that no devices are connected to the plurality of USB ports; and
   allocating, by the controller, a portion of the system power to each of the plurality of USB ports, responsive to the change in the port connection status.

6. The method of claim 1, further comprising:
   determining, by the controller, that the change in port connection status indicates that only a first device is connected to a first USB port of the plurality of USB ports;
   allocating, by the controller, an amount of the system power to the first USB port, the amount being equal to a first power requirement of the first device;
   determining, by the controller, a residual power to the first USB port, the residual power being equal to a difference between the system power and the first power requirement; and
   allocating, by the controller, a portion of the residual power to each unconnected USB port of the plurality of USB ports, responsive to the change in the port connection status.

7. The method of claim 1, further comprising:
   determining, by the controller, that the change in port connection status indicates that a subset of the plurality of devices is connected to a subset of the plurality of USB ports, the subset of the plurality of devices being more than one device;
   determining, by the controller, an order of power requirements for the subset of the plurality of devices;
   allocating, by the controller, a portion of the system power to each of the plurality of USB ports based on the power requirements;
   determining, by the controller, an amount of unused power of the system power after allocating the portion to each of the plurality of USB ports; and
   redistributing, by the controller, the amount of unused power to at least one of the subset of the plurality of USB ports.

8. The method of claim 1, further comprising:
   determining, by the controller, whether the change in the port connection status remains consistent through the specified duration of time; and
   ignoring, by the controller, the change in the port connection status responsive to the change in the port connection status not remaining consistent during the specified duration of time.

9. The method of claim 1, further comprising:
   determining, by the controller, a load sharing role of the controller as either a master or a slave, the controller being coupled to a first port of the plurality of USB ports; and
   responsive to a determination that the load sharing role of the controller is the master, polling for one or more slaves over a communication interface and initiating a master finite state machine, each of the one or more slaves being an additional controller coupled to one of the plurality of USB ports; or responsive to a determination that the load sharing role of the controller is the slave, registering the controller with the master over the communication interface to receive master commands and initiating a slave finite state machine, the master being a second controller coupled to a second port of the plurality of USB ports.

10. The method of claim 9, further comprising:

determining, by the slave, whether a master command has been received from the master, wherein the master command is at least one of a first command that sets a power delivery power (PDP) for the first port, a second command that starts or stops a heartbeat signaling between the slave and the master over the communication interface, or a third command that provides a port connection status of the first port;

determining, by the slave, whether a communication fault has occurred between the master and the slave over the communication interface and, responsive to the communication fault, adjusting a slave power budget for the first port to a fair share allocation of the system power, the slave power budget being greater than the fair share allocation; and monitoring, by the slave, for a change in the port connection status of the first port and, responsive to a change in the port connection status of the first port, reporting the change to the master over the communication interface.

11. The method of claim 9, further comprising:

determining, by the master, whether a communication fault has occurred between the master and the slave over the communication interface and, responsive to the communication fault, adjusting a master power budget for the first port to a fair share allocation of the system power, the master power budget being greater than the fair share allocation; and i) responsive to a determination that the port connection status indicates that more than one of the plurality of USB ports are connected to devices, determining, by the master, an order of power requirements for the plurality of devices;

allocating, by the master, a first portion of the system power to each of the plurality of USB ports based on the power requirements; and redistributing, by the master, an amount of unused power of the system power to one or more of the plurality of USB ports after allocating a first fraction to each of the plurality of USB ports, the one or more of the plurality of USB ports being coupled to one or more devices having a power requirement higher than the first fraction;

ii) responsive to a determination that the port connection status indicates that only a first port of plurality of USB ports is connected to a first device, allocating, by the master, an amount of the system power to the first port, the amount being equal to a first power requirement of the first device; and allocating, by the master, a second portion of a residual power, which is a difference between the system power and the first power requirement, to a remaining set of the plurality of USB ports; or iii) responsive to a determination that the port connection status indicates that no devices are connected to the plurality of USB ports, allocating, by the master, the first portion of the system power to each of the plurality of USB ports.

12. A system comprising:

a first USB Type-C Power Delivery (USB-C/PD) port:

a second USB port; a first controller operatively coupled to the first USB-C/PD port and the second USB port; a communication interface; and a second controller coupled to the first controller via the communication interface, the second controller being coupled to control the second USB port and the first controller being coupled to control the first USB-C/PD port, wherein the first controller is configured to:

determine a port connection status of the first USB-C/PD port and the second USB port, the port connection status indicating that a first device is connected to the first USB-C/PD port and a second device is connected to the second USB port;

determine a first power requirement of the first device and a second power requirement of the second device;

dynamically allocate a system power between the first USB-C/PD port and the second USB port, independent of a connection sequence of the first USB-C/PD port and the second USB port;

determine a change in the port connection status of the first USB-C/PD port and the second USB port; and reallocate the system power between the first USB-C PD port and the second USB port, responsive to the change in the port connection status remaining consistent during a specified duration of time, detect a communication fault between the first controller and the second controller; and performing a power budget reduction responsive to detection of the communication fault, wherein performing the power budget reduction comprises re-allocating a portion of the system power to the first USB-C/PD port and the second USB port.

13. The system of claim 12, further comprising:

a first power converter coupled to the first controller and a power source that supplies the system power;

a second power converter coupled to the power source;

a first power field effect transistor (FET) coupled between the first power converter and the first USB-C/PD port, the first power FET controlled by the first controller; and a second power FET coupled between the second power converter and the second USB port, the second power FET controlled by the second controller.

14. The system of claim 13, wherein the first power converter is a first direct-current to direct-current (DC-DC) converter of a shared multi-port power adapter, wherein the second power converter is a second DC-DC converter of the shared multi-port power adapter.

15. The system of claim 14, wherein the shared multi-port power adapter is part of a headunit of an automobile, a rear-seat entertainment system of the automobile, or a rear-seat charger of the automobile.

16. The system of claim 14, wherein the first power converter is a first alternative-current to direct-current (AC-DC) converter of a shared multi-port power adapter, wherein the second power converter is a second AC-DC converter of the shared multi-port power adapter, wherein the shared multi-port power adapter is part of a multi-port wall charger, a multi-port power hub, or a multi-port power bank.

17. A USB Type-C Power Delivery (USB-C/PD) controller comprising:

a first terminal coupled to a first USB-C/PD port of a plurality of USB-ports of a multi-port adapter;

a set of terminals coupled to a communication interface coupled to at least a second USB-C/PD controller that is coupled to a second USB-C/PD port; and a processing circuit coupled to the first terminal and the set of terminals, the processing circuit to:

determine a port connection status of the plurality of USB ports, the port connection status indicating that a plurality of devices are connected;

determine a power requirement of each of the plurality of devices;

dynamically allocate a system power between each of the plurality of USB ports, independent of a connection sequence of the plurality of devices;

determine a change in the port connection status; reallocate the system power between each of the plurality of USB ports, responsive to the change in the port connection status remaining consistent during a specified duration of time, detect a communication fault between the USB Type-C Power Delivery (USB-C/PD) controller and the second USB-C/PD controller; and performing a power budget reduction responsive to detection of the communication fault, wherein performing the power budget reduction comprises re-allocating a portion of the system power to each of the plurality of USB ports.

18. The USB-C/PD controller of claim 17, wherein, to dynamically allocate the system power, the processing circuit is to:

determine an order of power requirements for the plurality of devices; and allocate a portion of the system power to each of the plurality of USB ports based on the power requirements.

19. The USB-C/PD controller of claim 18, wherein, to dynamically allocate the system power, the processing circuit is further to:

determine an amount of unused power of the system power after allocating the portion to each of the plurality of USB ports; and redistribute the amount of unused power to at least one of the plurality of USB ports.

20. The USB-C/PD controller of claim 17, wherein the processing circuit is further to:

determine that the change in port connection status indicates that no devices are connected to the plurality of USB ports; and allocate a portion of the system power to each of the plurality of USB ports based on the power requirements, responsive to the change in the port connection status.

21. The USB-C/PD controller of claim 17, wherein the processing circuit is further to:

determine that the change in port connection status indicates that only a first device is connected to a first USB-C/PD port of the plurality of USB ports;

allocate an amount of the system power that is equal to a first power requirement of the first device;

determine a residual power that is a difference between the system power and the first power requirement; and allocate a portion of the residual power to each unconnected USB port of the plurality of USB ports based on the power requirements, responsive to the change in the port connection status.

* * * * *